(12) United States Patent
Pitner et al.

(10) Patent No.: US 11,749,736 B2
(45) Date of Patent: Sep. 5, 2023

(54) THREE-DIMENSIONAL MEMORY DEVICE INCLUDING DISCRETE CHARGE STORAGE ELEMENTS AND METHODS FOR FORMING THE SAME

(71) Applicant: SANDISK TECHNOLOGIES LLC, Addison, TX (US)

(72) Inventors: Xue Bai Pitner, San Jose, CA (US); Raghuveer S. Makala, Campbell, CA (US); Fei Zhou, San Jose, CA (US); Senaka Kanakamedala, San Jose, CA (US); Ramy Nashed Bassely Said, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 180 days.

(21) Appl. No.: 17/189,153

(22) Filed: Mar. 1, 2021

(65) Prior Publication Data
US 2022/0278216 A1    Sep. 1, 2022

(51) Int. Cl.
*H01L 29/423*    (2006.01)
*H01L 21/28*    (2006.01)
(Continued)

(52) U.S. Cl.
CPC .. *H01L 29/42364* (2013.01); *H01L 29/40111* (2019.08); *H01L 29/40114* (2019.08); *H01L 29/40117* (2019.08); *H01L 29/7827* (2013.01); *H10B 41/27* (2023.02); *H10B 43/27* (2023.02); *H10B 51/20* (2023.02)

(58) Field of Classification Search
None
See application file for complete search history.

(56) References Cited

U.S. PATENT DOCUMENTS

| 8,658,499 B2 | 2/2014 | Makala et al. |
| 9,252,151 B2 | 2/2016 | Chien et al. |
| (Continued) | | |

FOREIGN PATENT DOCUMENTS

WO    2020251637 A1    12/2020

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Hsien Ming Lee
(74) *Attorney, Agent, or Firm* — THE MARBURY LAW GROUP PLLC

(57) ABSTRACT

A memory device includes an alternating stack of insulating layers and electrically conductive layers, a memory opening vertically extending through the alternating stack, and memory opening fill structures located in the memory opening and including a vertical semiconductor channel, a dielectric material liner laterally surrounding the vertical semiconductor channel, and a vertical stack of discrete memory elements laterally surrounding the dielectric material liner. A subset of the insulating layers a lower insulating sublayer, an upper insulating sublayer overlying the lower insulating sublayer, and a center insulating sublayer located between and in contact with the lower insulating sublayer and the upper insulating sublayer.

9 Claims, 22 Drawing Sheets

(51) Int. Cl.
*H01L 29/78* (2006.01)
*H10B 41/27* (2023.01)
*H10B 43/27* (2023.01)
*H10B 51/20* (2023.01)

(56) References Cited

U.S. PATENT DOCUMENTS

| | | | |
|---|---|---|---|
| 9,356,031 | B2 | 5/2016 | Lee et al. |
| 9,397,093 | B2 | 7/2016 | Makala et al. |
| 9,419,012 | B1 | 8/2016 | Shimabukuro et al. |
| 9,576,975 | B2 | 2/2017 | Zhang et al. |
| 9,659,955 | B1 | 5/2017 | Sharangpani et al. |
| 9,691,884 | B2 | 6/2017 | Makala et al. |
| 9,875,929 | B1 | 1/2018 | Shukla et al. |
| 10,373,969 | B2 | 8/2019 | Zhang et al. |
| 10,516,025 | B1 | 12/2019 | Nishikawa et al. |
| 2011/0312153 | A1 | 12/2011 | Servalli et al. |
| 2014/0225181 | A1 | 8/2014 | Makala et al. |
| 2016/0043093 | A1 | 2/2016 | Lee et al. |
| 2017/0125436 | A1 | 5/2017 | Sharangpani et al. |
| 2019/0214395 | A1 | 7/2019 | Zhang et al. |
| 2019/0386108 | A1 | 12/2019 | Nishikawa et al. |
| 2020/0006375 | A1 | 1/2020 | Zhou et al. |
| 2021/0050359 | A1* | 2/2021 | Kai .................. H01L 27/11597 |

OTHER PUBLICATIONS

U.S. Appl. No. 16/582,262, filed Sep. 25, 2019, SanDisk Technologies LLC.
U.S. Appl. No. 16/794,536, filed Feb. 19, 2020, SanDisk Technologies LLC.
U.S. Appl. No. 16/794,563, filed Feb. 19, 2020, SanDisk Technologies LLC.
U.S. Appl. No. 16/849,600, filed Apr. 15, 2020, SanDisk Technologies LLC.
U.S. Appl. No. 16/849,664, filed Apr. 15, 2020, SanDisk Technologies LLC.
U.S. Appl. No. 17/001,003, filed Aug. 24, 2020, SanDisk Technologies LLC.
U.S. Appl. No. 17/090,420, filed Nov. 5, 2020, SanDisk Technologies LLC.
U.S. Appl. No. 17/169,987, filed Feb. 8, 2021, SanDisk Technologies LLC.
Notification of Transmittal of the International Search Report and the Written Opinion of the International Searching Authority for International Patent Application No. PCT/US2021/035150, dated Oct. 4, 2021, 12 pages.

* cited by examiner

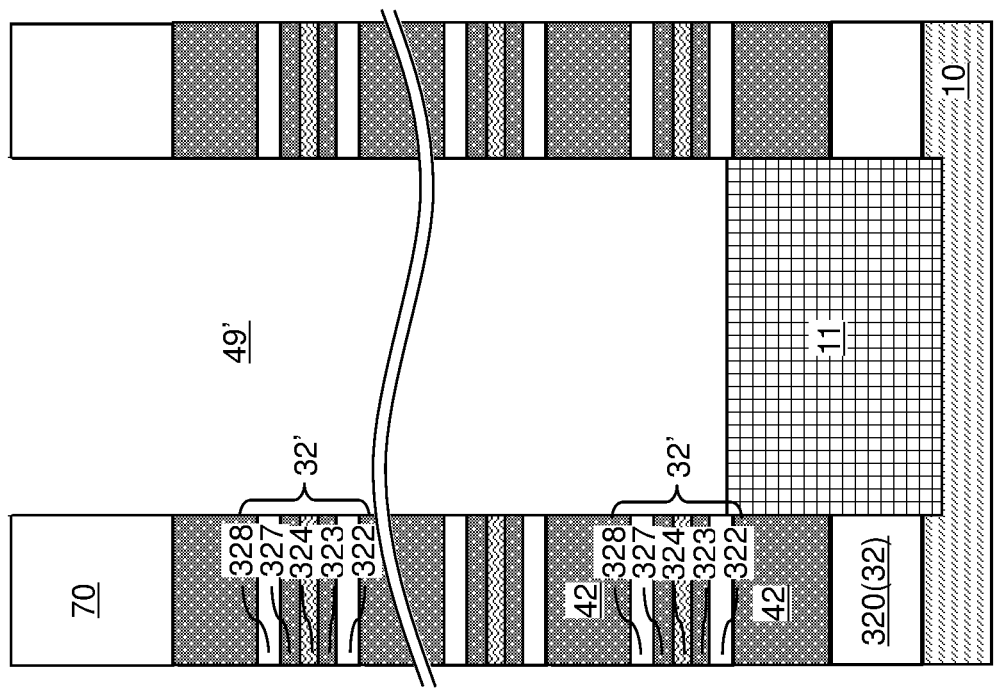
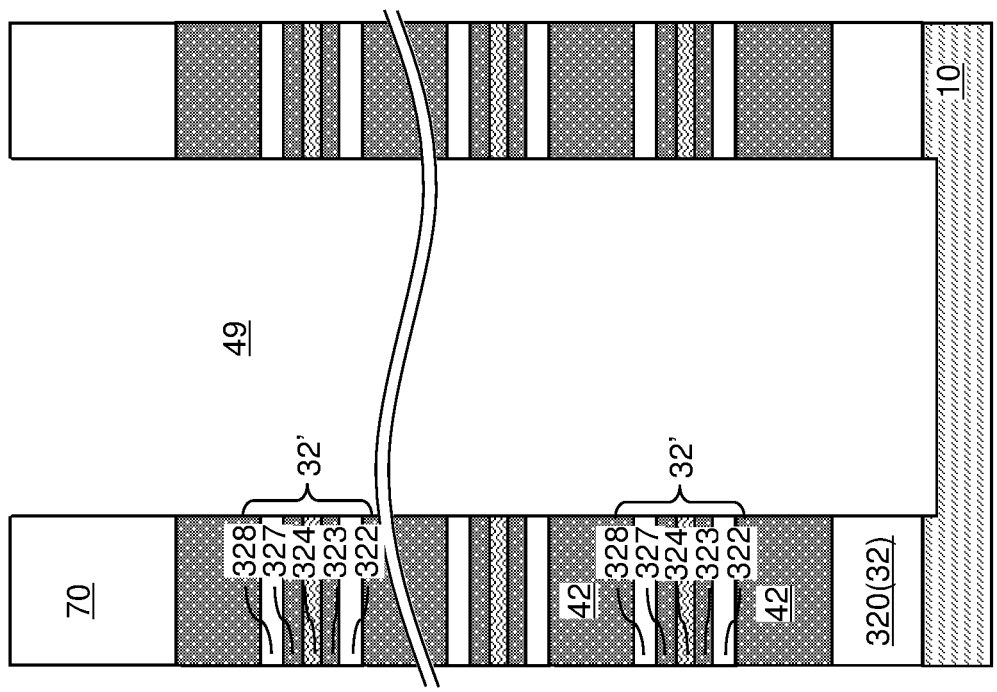

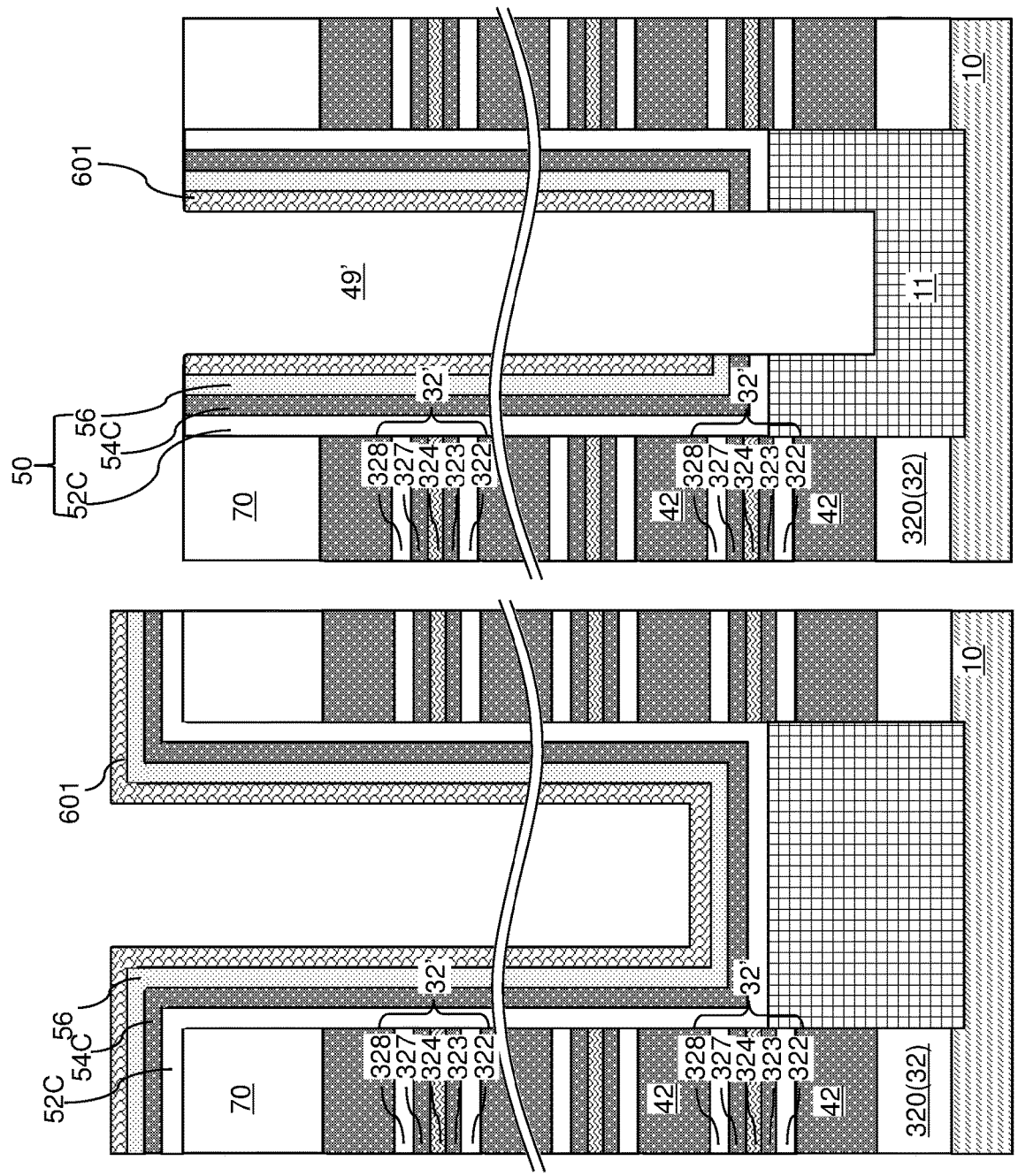

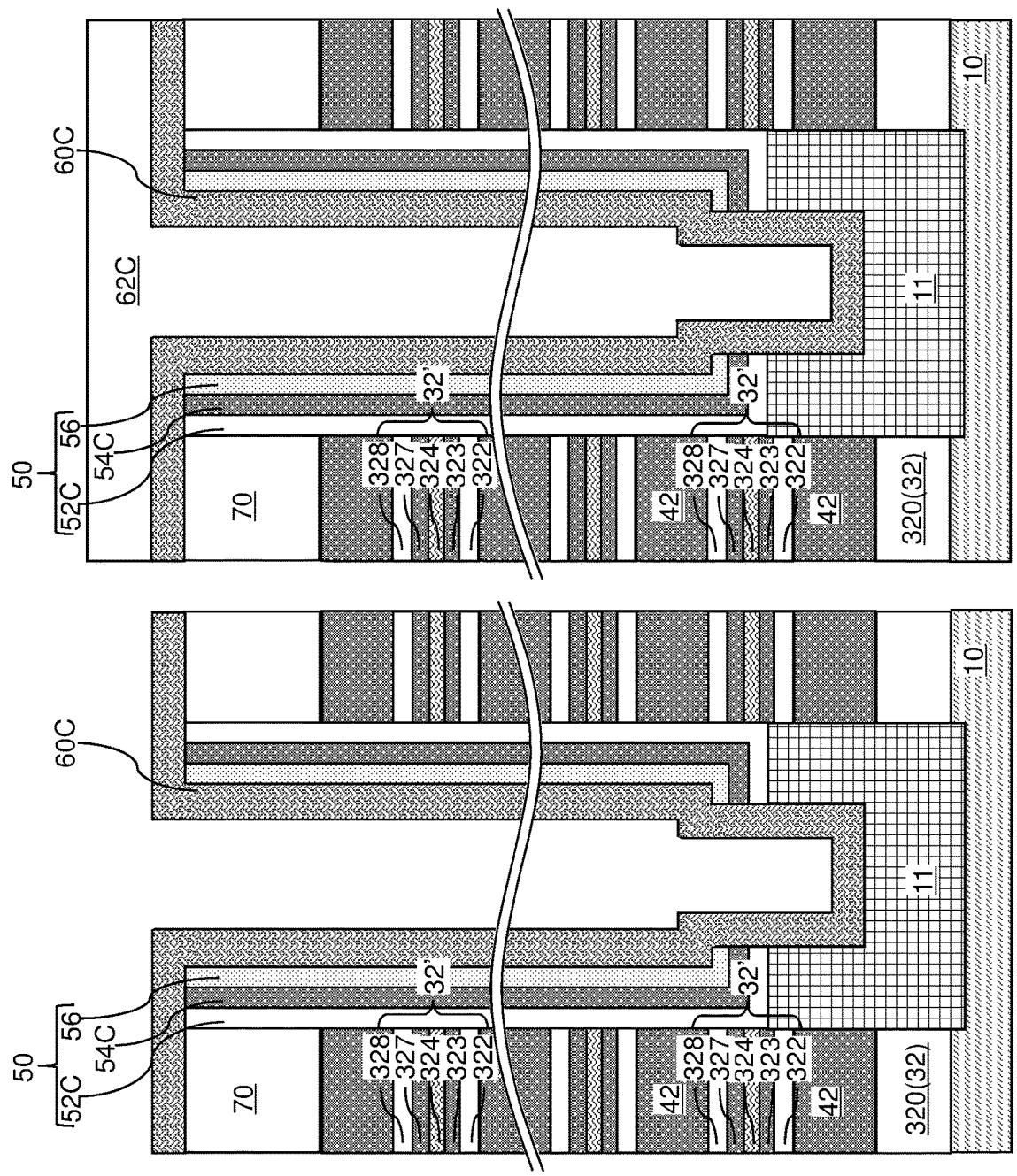

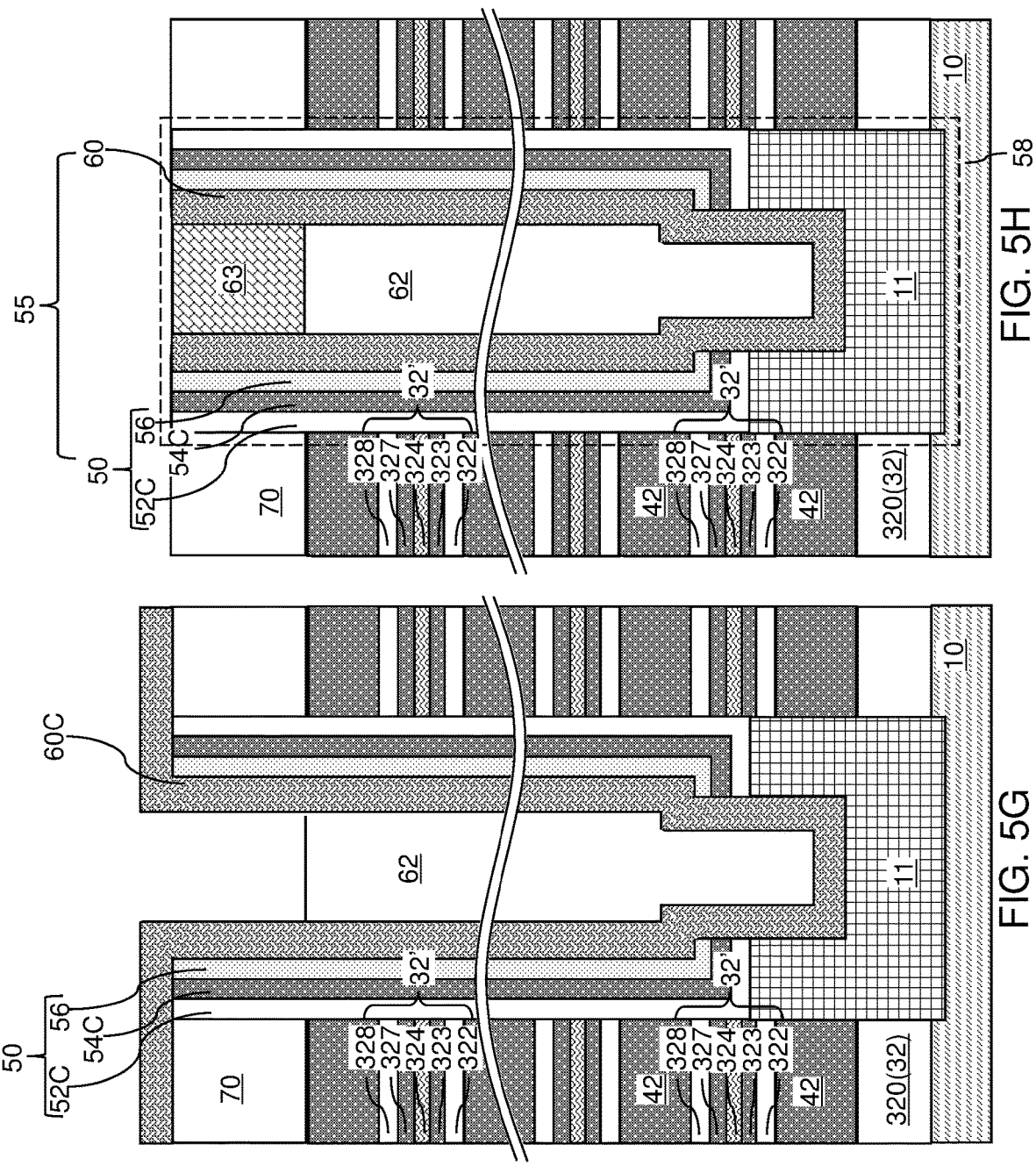

THREE-DIMENSIONAL MEMORY DEVICE INCLUDING DISCRETE CHARGE STORAGE ELEMENTS AND METHODS FOR FORMING THE SAME

FIELD

The present disclosure relates generally to the field of semiconductor devices, and particularly to a three-dimensional memory device including discrete charge storage elements and methods for forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: an alternating stack of insulating layers and electrically conductive layers located over a substrate; a memory opening vertically extending through the alternating stack; and a memory opening fill structure located in the memory opening and comprising a vertical semiconductor channel, a dielectric material liner laterally surrounding the vertical semiconductor channel, and a vertical stack of discrete memory elements laterally surrounding the dielectric material liner. A subset of the insulating layers comprises a respective contiguous set of a lower insulating sublayer, an upper insulating sublayer overlying the lower insulating sublayer, and a center insulating sublayer located between and in contact with the lower insulating sublayer and the upper insulating sublayer. The center insulating sublayer contacts an annular concave bottom surface of a respective overlying discrete memory element, and contacts an annular concave top surface of a respective underlying discrete memory element.

According to another aspect of the present disclosure, a method of forming a memory device comprises: forming a vertical repetition of a unit layer stack, wherein the unit layer stack comprises a sacrificial material layer and a set of layers including, from bottom to top, a lower insulating sublayer, a first spacer-level sacrificial sublayer, a disposable material sublayer, a second spacer-level sacrificial sublayer, and an upper insulating sublayer; forming memory openings through the vertical repetition; forming memory opening fill structures in the memory openings, wherein each of the memory opening fill structures comprises a vertical semiconductor channel and a memory material layer; forming a backside trench through the vertical repetition; forming insulating-level backside recesses by removing the disposable material sublayers selective to materials of the sacrificial material layers, the lower insulating sublayers, the first spacer-level sacrificial sublayers, the second spacer-level sacrificial sublayers, and the upper insulating sublayers employing a first isotropic etch process; removing the first spacer-level sacrificial sublayers and the second spacer-level sacrificial sublayers selective to the lower insulating sublayers and the upper insulating sublayers employing a second isotropic etch process, whereby the insulating-level backside recesses are expanded in volume; depositing center insulating sublayers within the insulating-level backside recesses, wherein each contiguous combination of a lower insulating sublayer, an upper insulating sublayer, and a center insulating sublayer comprises a composite insulating layer, and wherein an alternating stack of composite insulating layers and the sacrificial material layers is formed; and replacing the sacrificial material layers with electrically conductive layers after the step of depositing the center insulating sublayers.

BRIEF DESCRIPTION OF THE DRAWINGS

FIGS. 5A-5H are sequential schematic vertical cross-sectional views of a memory opening within the exemplary structure during formation of a memory opening fill structure according to an embodiment of the present disclosure.

DETAILED DESCRIPTION

Figure 1:
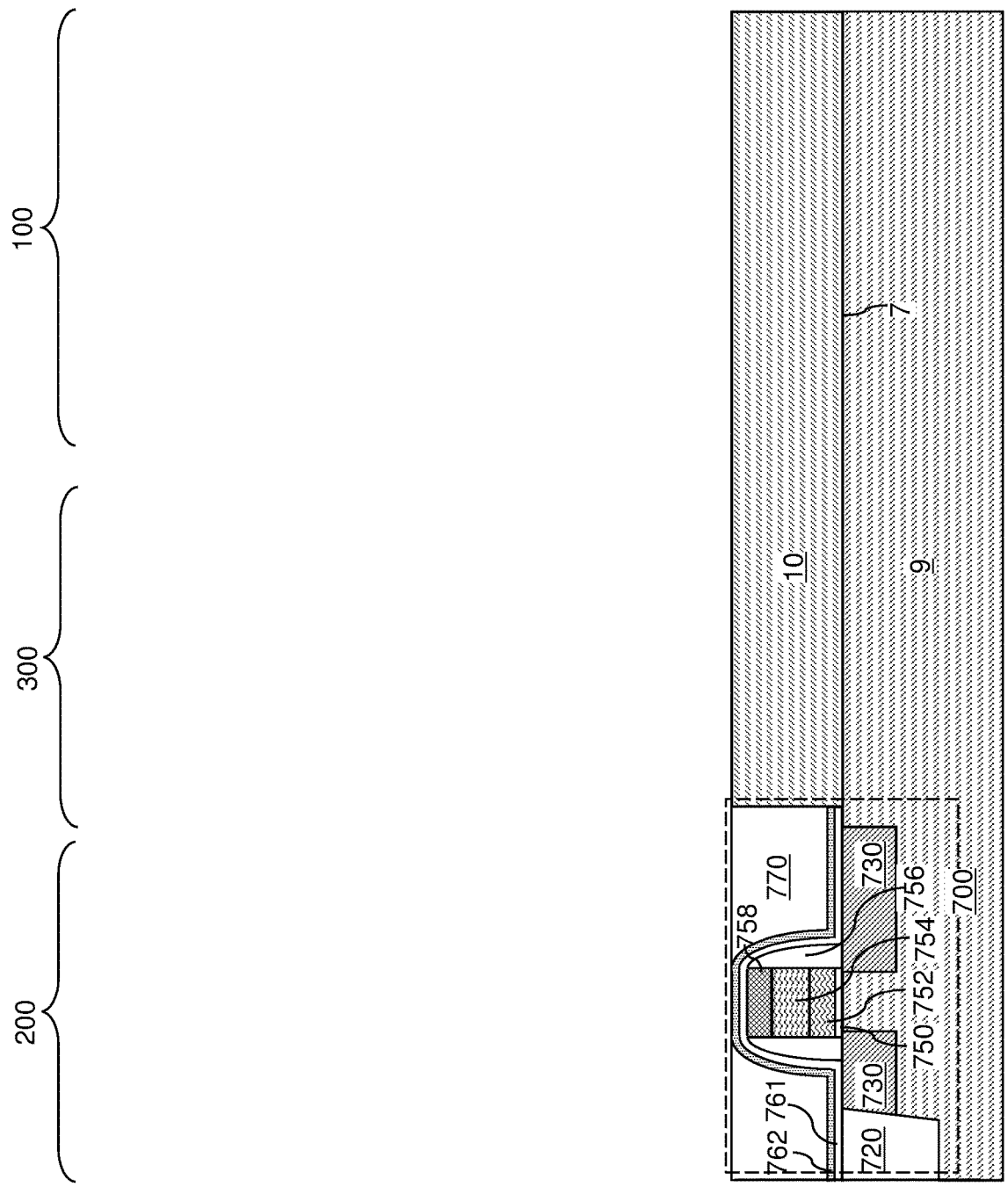
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device including discrete charge storage elements and methods for forming the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
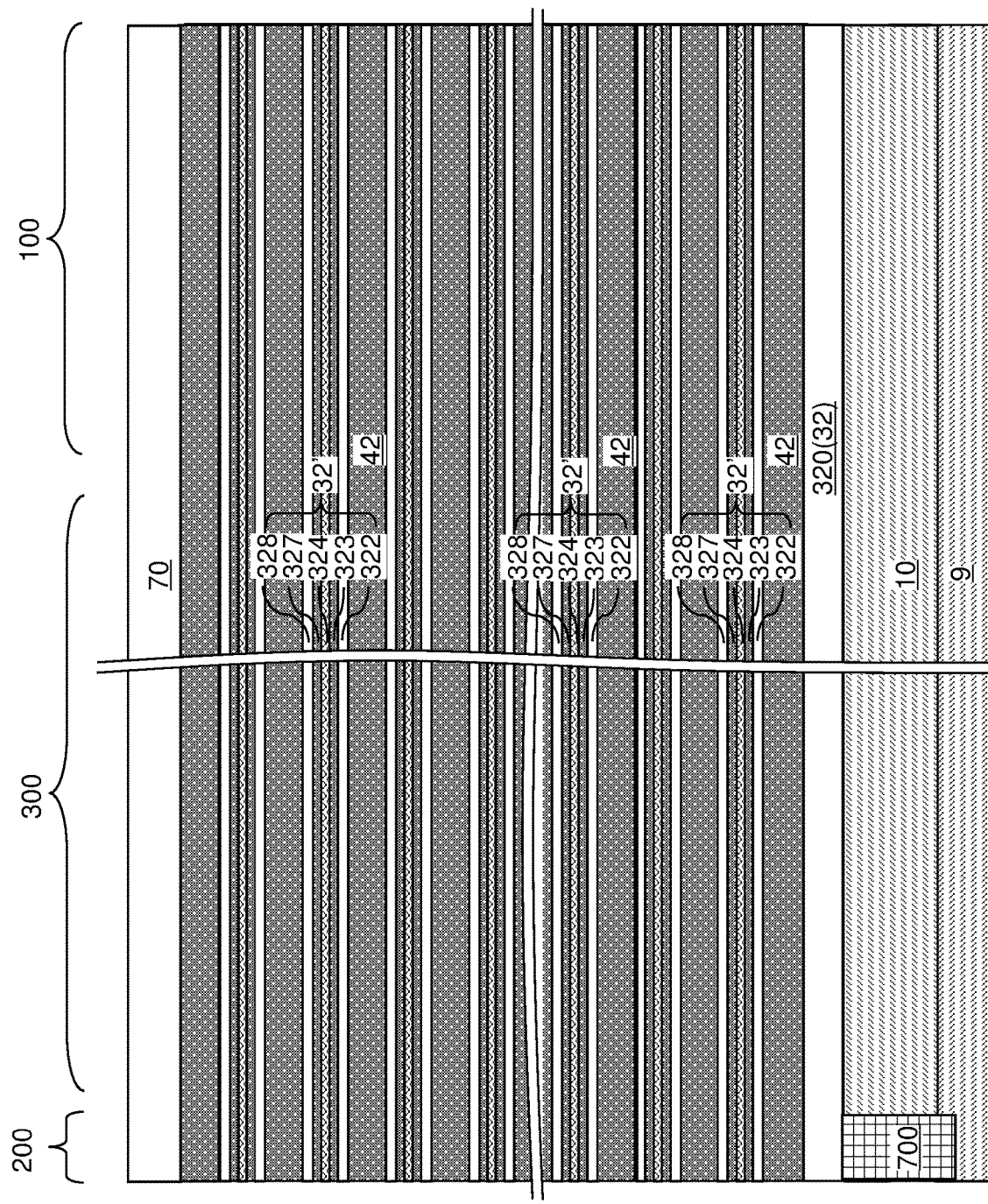
FIG. 2 is a schematic vertical cross-sectional view of the exemplary structure after formation of a vertical repetition of a unit layer stack according to an embodiment of the present disclosure.

Referring to FIG. 2, a bottommost insulating layer 320 can be formed over the semiconductor material layer 10. The bottommost insulating layer 320 includes an insulating material such as silicon oxide, and may have a thickness in a range from 3 nm to 60 nm, such as from 10 nm to 30 nm, although lesser and greater thicknesses may also be employed. The bottommost insulating layer 320 is one of the insulating layers 32 to be formed in a final device structure.

A vertical repetition of a unit layer stack (32', 42) can be formed over the semiconductor material layer 10. The unit layer stack comprises, from bottom to top, a sacrificial material layer 42 and an in-process spacer-level layer stack 32' that includes a set of layers including, from bottom to top, a lower insulating sublayer 322, a first spacer-level sacrificial sublayer 323, a disposable material sublayer 324, a second spacer-level sacrificial sublayer 327, and an upper insulating sublayer 328.

In one embodiment, the first spacer-level sacrificial sublayers 323 and the second spacer-level sacrificial sublayers 327 may comprise, and/or may consist essentially of, a same sacrificial material that may be subsequently isotropically etched selective to the materials of the sacrificial material layers 42, the lower insulating sublayers 322 and the upper insulating sublayers 328. The disposable material sublayer 324 includes a disposable material that may be disposed, i.e., removed, selective to the materials of the sacrificial material layers 42, the first spacer-level sacrificial sublayers 323, and the second spacer-level sacrificial sublayers 327 and selective to the materials of the lower insulating sublayers 322 and the upper insulating sublayers 328.

In a first non-limiting illustrative example, the sacrificial material layers 42, the first spacer-level sacrificial sublayers 323, and the second spacer-level sacrificial sublayers 327 can comprise, and/or can consist essentially of, silicon nitride. The sacrificial material layers 42 can comprise silicon nitride having a first density while the first spacer-level sacrificial sublayers 323, and the second spacer-level sacrificial sublayers 327 can comprise silicon nitride having a second density which is lower than the first density of the sacrificial material layers 42. The second density may be lower by at least 5%, such as 5 to 15%, for example 7 to 10% than the first density. For example, the first and second spacer-level sacrificial sublayers (323, 327) may include a more porous silicon nitride material having a density in a range from 2.2 g/cm$^3$ to 2.35 g/cm$^3$. Such a porous silicon nitride material may be deposited by a plasma enhanced chemical vapor deposition process in which a higher plasma power is employed, and can have an etch rate in a range from 25 nm/min to 90 nm/min, such as 80 nm/min to 88 nm/min in a 100:1 dilute hydrofluoric acid at room temperature. In contrast, the sacrificial material layers 42 may include a non-porous silicon nitride material or a less porous silicon nitride material having a greater density than the more porous silicon nitride material of the spacer-level sacrificial sublayers. In one embodiment, the sacrificial material layers 42 can have a density in a range from 2.45 g/cm$^3$ to 2.65 g/cm$^3$. Such non-porous or less porous silicon nitride material may be deposited by a plasma enhanced chemical vapor deposition process in which a lower plasma power is employed, and can have an etch rate in a range from 2.5 nm/min to 20 nm/min, in a 100:1 dilute hydrofluoric acid at room temperature.

The lower insulating sublayers 322 and the upper insulating sublayers 328 can comprise, and/or can consist essentially of, a silicon oxide material (such as undoped silicate glass or a doped silicate glass), and the disposable material sublayer 324 can comprise, and/or can consist essentially of, a semiconductor material such as amorphous silicon, polysilicon, silicon-germanium, or germanium, a carbon-based material such as amorphous carbon or diamond-like carbon (DLC), porous or non-porous organosilicate glass, or highly porous silicon nitride which has a third density lower than the second density.

In a second non-limiting illustrative example, the sacrificial material layers 42, the first spacer-level sacrificial sublayers 323, and the second spacer-level sacrificial sublayers 327 can comprise, and/or can consist essentially of, silicon, silicon-germanium or germanium. The sacrificial material layers 42 can comprise silicon or silicon-germanium having a first germanium concentration. The first spacer-level sacrificial sublayers 323 and the second spacer-level sacrificial sublayers 327 can comprise germanium or silicon-germanium having a second germanium concentration higher than the first germanium concentration. The lower insulating sublayers 322 and the upper insulating sublayers 328 can comprise, and/or can consist essentially of, a silicon oxide material (such as undoped silicate glass or a doped silicate glass), and the disposable material sublayer 324 can comprise, and/or can consist essentially of, silicon nitride, a semiconductor material such as amorphous silicon or polysilicon or silicon-germanium having a third germanium concentration which is higher than the second germanium concentration, a carbon-based material such as amorphous carbon or diamond-like carbon (DLC), or porous or non-porous organosilicate glass.

The thicknesses of each in-process spacer-level layer stack 32' can be in a range from 20 nm to 50 nm, although lesser and greater thicknesses can be employed for each in-process spacer-level layer stack 32'. The thickness of each of the lower insulating sublayer 322, the first spacer-level sacrificial sublayer 323, the disposable material sublayer 324, the second spacer-level sacrificial sublayer 327, and the upper insulating sublayer 328 within an in-process spacer-level layer stack 32' may be in a range from 5% to 40%, such as from 8% to 35%, of the thickness of the in-process spacer-level layer stack 32'. Each sublayer may be 2 to 10 nm thick. Each of the first and second insulating sublayers (322, 328) may be thicker than each of the first spacer-level sacrificial sublayer 323, the disposable material sublayer 324, and the second spacer-level sacrificial sublayer 327. Each of the first and second insulating sublayers (322, 328) may have a thickness of 5 nm to 10 nm, while each of the first spacer-level sacrificial sublayer 323, the disposable material sublayer 324, and the second spacer-level sacrificial sublayer 327 may have a thickness of 2 nm to 4 nm. The thicknesses of each sacrificial material layer 42 can be in a range from 20 nm to 50 nm, although lesser and greater thicknesses can be employed for each sacrificial material layer 42.

In one embodiment, the vertical repetition of a unit layer stack (32', 42) may be a periodic structure having a periodicity of the thickness of the unit layer stack (32', 42). The number of repetitions of the unit layer stack (32', 42) can be in a range from 2 to 1,024, and typically from 8 to 256, although a greater number of repetitions can also be employed. A topmost instance of a sacrificial material layer 42 (i.e., a topmost sacrificial material layer 42) may be formed on the topmost unit layer stack (32', 42), i.e., on the topmost instance of the in-process spacer-level layer stack 32'.

Optionally, an insulating cap layer 70 can be formed over the topmost sacrificial material layer 42. The insulating cap layer 70 includes a dielectric material that is different from the material of the composite sacrificial material layers 42. In one embodiment, the insulating cap layer 70 can include any dielectric material that can be employed for the bottommost insulating layer 320. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
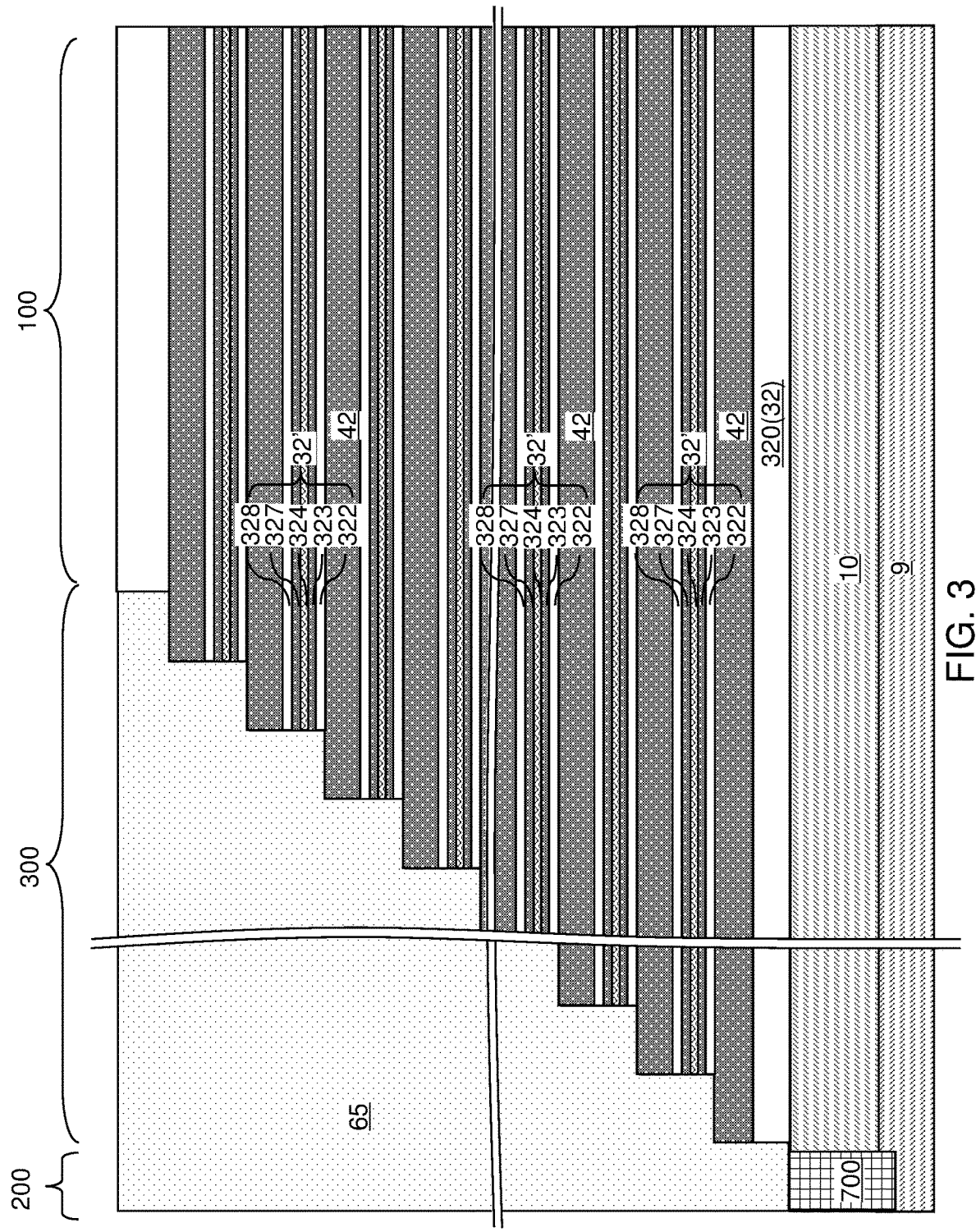
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed in the contact regions 300 at an end portion of the vertical repetition (32', 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the vertical repetition (32', 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the vertical repetition (32', 42) laterally extends farther than any overlying sacrificial material layer 42 within the vertical repetition (32', 42) in the terrace region. The terrace region includes stepped surfaces of the vertical repetition (32', 42) that continuously extend from a bottommost layer within the vertical repetition (32', 42) to a topmost layer within the vertical repetition (32', 42).

Each vertical step of the stepped surfaces can have the height of one or more pairs of an in-process spacer-level layer stack 32' and a sacrificial material layer. In one embodiment, each vertical step can have the height of a single pair of an in-process spacer-level layer stack 32' and a sacrificial material layer 42. In another embodiment, multiple "columns" of staircases can be formed along a first horizontal direction hd1 such that each vertical step has the height of a plurality of pairs of an in-process spacer-level layer stack 32' and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
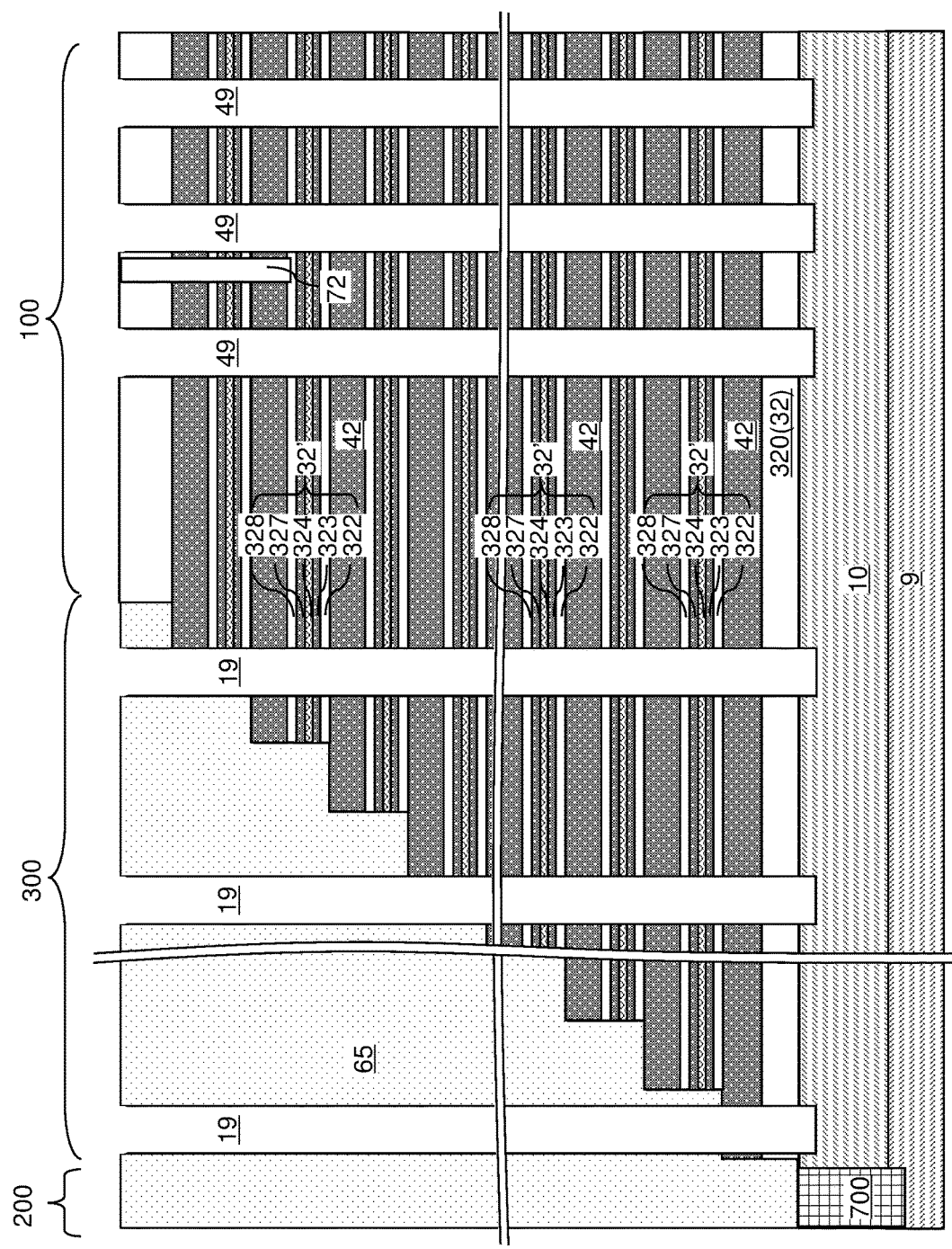
FIG. 4A is a schematic vertical cross-sectional view of the exemplary structure after formation of memory openings and support openings according to an embodiment of the present disclosure.
Figure 4B:
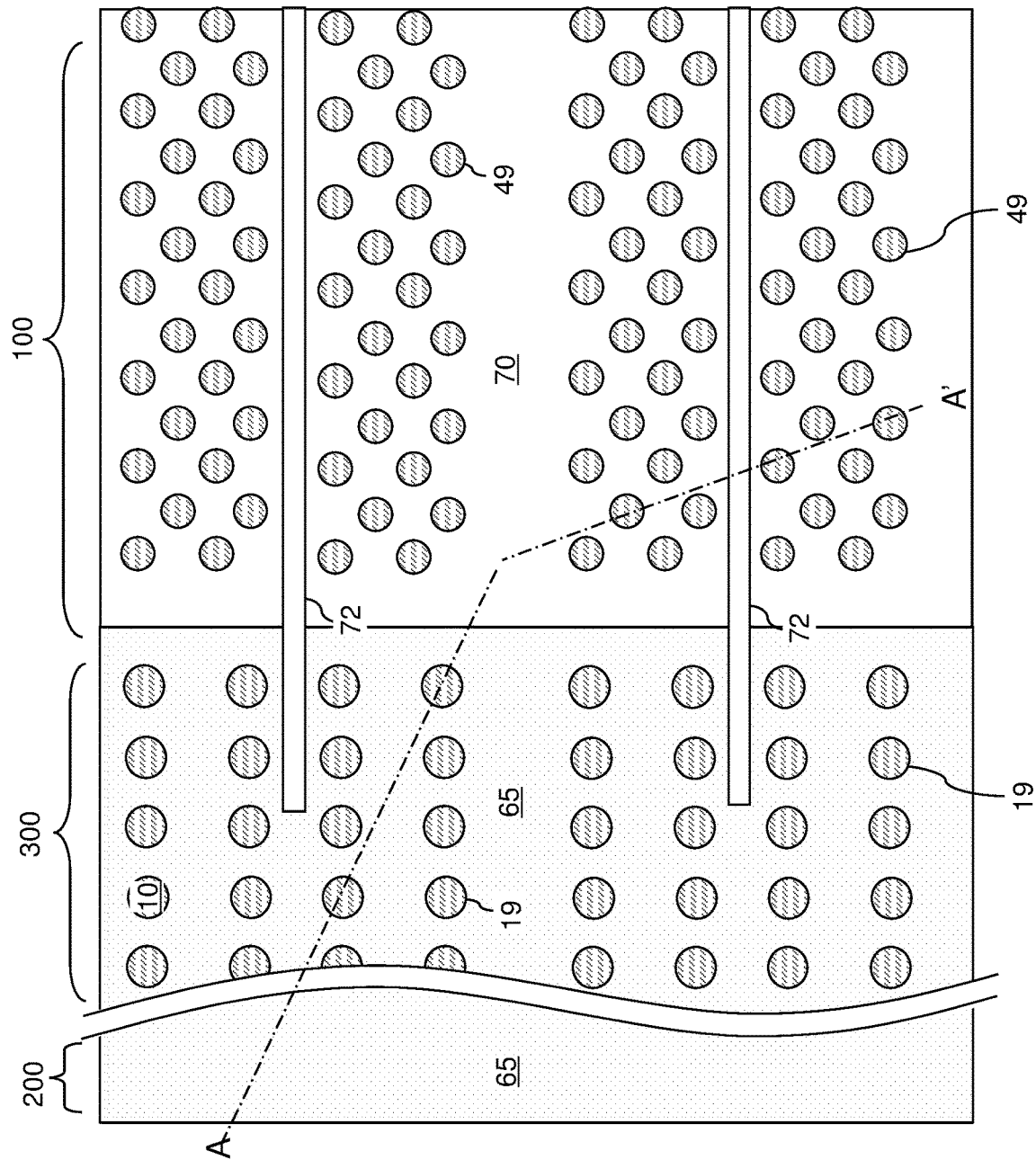
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the vertical repetition (32', 42) by at least one anisotropic etch that employs the patterned lithographic material stack as an etch mask. Portions of the vertical repetition (32', 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the vertical repetition (32', 42) in the memory array region 100. The support openings 19 are formed through the retro-stepped dielectric material portion 65 and the portion of the vertical repetition (32', 42) that underlie the stepped surfaces in the contact region 300. Preferably, the layers of the vertical repetition (32', 42) have the same or similar anisotropic etch rates.

The memory openings 49 extend through the entirety of the vertical repetition (32', 42). The support openings 19 extend through a subset of layers within the vertical repetition (32', 42). The chemistry of the anisotropic etch process employed to etch through the materials of the vertical repetition (32', 42) can alternate to optimize etching of the various materials in the vertical repetition (32', 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the vertical repetition (32', 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the vertical repetition (32', 42), and optionally into an upper portion of the semiconductor material layer 10. At this processing step, each support opening 19 can extend through the retro-stepped dielectric material portion 65, a subset of layers in the vertical repetition (32', 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including an optional blocking dielectric layer 52C, a memory material layer 54C, a dielectric material liner 56, and an optional sacrificial cover material layer 601 can be sequentially deposited in the memory openings 49.

The optional blocking dielectric layer 52C can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least one oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52C can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52C includes aluminum oxide. In one embodiment, the blocking dielectric layer 52C can include multiple dielectric metal oxide layers having different material compositions.

Alternatively or additionally, the blocking dielectric layer 52C can include a dielectric semiconductor compound such as silicon oxide, silicon oxynitride, silicon nitride, or a combination thereof. In one embodiment, the blocking dielectric layer 52C can include silicon oxide, which can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52C can be omitted, and a backside blocking dielectric layer can be formed after formation of backside recesses on surfaces of memory films to be subsequently formed.

Subsequently, the memory material layer 54C can be deposited as a continuous material layer by a conformal deposition process such as a chemical vapor deposition process or an atomic layer deposition process. The memory material layer 54C includes a memory material, i.e., a material that can store data by selecting a state of the material. For example, the memory material layer 54C may include a charge storage material such as silicon nitride, polysilicon, or a metallic material, a ferroelectric material that can store information in the form of a polarization direction, or any other memory material that can store date by altering electrical resistivity. The memory material layer 54C can be formed, for example, by chemical vapor deposition (CVD), atomic layer deposition (ALD), physical vapor deposition (PVD), or any suitable deposition technique for storing electrical charges therein. The thickness of the memory material layer 54C can be in a range from 2 nm to 20 nm, although lesser and greater thicknesses can also be employed.

The dielectric material liner 56 includes a dielectric material. In one embodiment, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52C, 54C, 56, 601).

Referring to FIG. 5D, the optional sacrificial cover material layer 601, the dielectric material liner 56, the memory material layer 54C, and the blocking dielectric layer 52C are sequentially anisotropically etched employing at least one anisotropic etch process. The portions of the sacrificial cover material layer 601, the dielectric material liner 56, the memory material layer 54C, and the blocking dielectric layer 52C located above the top surface of the insulating cap layer 70 can be removed by the at least one anisotropic etch process. Further, the horizontal portions of the sacrificial cover material layer 601, the dielectric material liner 56, the memory material layer 54C, and the blocking dielectric layer 52C at a bottom of each memory cavity 49' can be removed to form openings in remaining portions thereof. Each of the sacrificial cover material layer 601, the dielectric material liner 56, the memory material layer 54C, and the blocking dielectric layer 52C can be etched by a respective anisotropic etch process employing a respective etch chemistry, which may, or may not, be the same for the various material layers.

Each remaining portion of the sacrificial cover material layer 601 can have a tubular configuration. The memory material layer 54C can comprise a charge trapping material, a floating gate material or a ferroelectric material. In one embodiment, each memory material layer 54C can include a vertical stack of charge storage regions that store electrical charges upon programming. In one embodiment, the memory material layer 54C can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54C, and the blocking dielectric layer 52C. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54C. A set of a blocking dielectric layer 52C, a memory material layer 54C, and a dielectric material liner 56 in a memory opening 49 constitutes a memory film 50, which includes a plurality of charge storage regions (comprising portions of the memory material layer 54C) that are insulated from surrounding materials by the blocking dielectric layer 52C and the dielectric material liner 56. In one embodiment, the sacrificial cover material layer 601, the dielectric material liner 56, the memory material layer 54C, and the blocking dielectric layer 52C can have vertically coincident sidewalls. The sacrificial cover material layer 601 can be subsequently removed selective to the material of the dielectric material liner 56. In case the sacrificial cover material layer 601 includes a semiconductor material, it may be retained in the device or removed using a wet etch process employing hot trimethyl-2 hydroxyethyl ammonium hydroxide ("hot TMY") or tetramethyl ammonium hydroxide (TMAH).

Referring to FIG. 5E, a semiconductor channel layer 60C can be deposited directly on the semiconductor surface of the pedestal channel portion 11 or the semiconductor material layer 10 if the pedestal channel portion 11 is omitted, and directly on the dielectric material liner 56. The semiconductor channel layer 60C includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60C includes amorphous silicon or polysilicon. The semiconductor channel layer 60C can be intrinsic or have a doping of a first conductivity type, which is the same as the conductivity type of the semiconductor material layer 10 and the pedestal channel portions 11. The semiconductor channel layer 60C can be formed by a conformal deposition method such as low pressure chemical vapor deposition (LPCVD). The thickness of the semiconductor channel layer 60C can be in a range from 2 nm to 10 nm, although lesser and greater thicknesses can also be employed. The semiconductor channel layer 60C may partially fill the memory cavity 49' in each memory opening, or may fully fill the cavity in each memory opening.

Referring to FIG. 5F, in case the memory cavity 49' in each memory opening is not completely filled by the semiconductor channel layer 60C, a dielectric core layer 62C can be deposited in the memory cavity 49' to fill any remaining portion of the memory cavity 49' within each memory opening. The dielectric core layer 62C includes a dielectric material such as silicon oxide or organosilicate glass. The dielectric core layer 62C can be deposited by a conformal deposition method such as low pressure chemical vapor deposition (LPCVD), or by a self-planarizing deposition process such as spin coating.

Referring to FIG. 5G, the horizontal portion of the dielectric core layer 62C can be removed, for example, by a recess etch process such that each remaining portions of the dielectric core layer 62C is located within a respective memory opening 49 and has a respective top surface below the horizontal plane including the top surface of the insulating cap layer 70. Each remaining portion of the dielectric core layer 62C constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60C can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60C (which has a doping of the first conductivity type) constitutes a vertical semiconductor channel 60.

A dielectric material liner 56 is surrounded by a memory material layer 54C, and laterally surrounds a portion of the vertical semiconductor channel 60. Each adjoining set of a blocking dielectric layer 52C, a memory material layer 54C, and a dielectric material liner 56 collectively constitute a memory film 50, which can store electrical charges or ferroelectric polarization with a macroscopic retention time. In some embodiments, a blocking dielectric layer 52C may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel 60, a dielectric material liner 56, a memory material layer 54C, and an optional blocking dielectric layer 52C. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
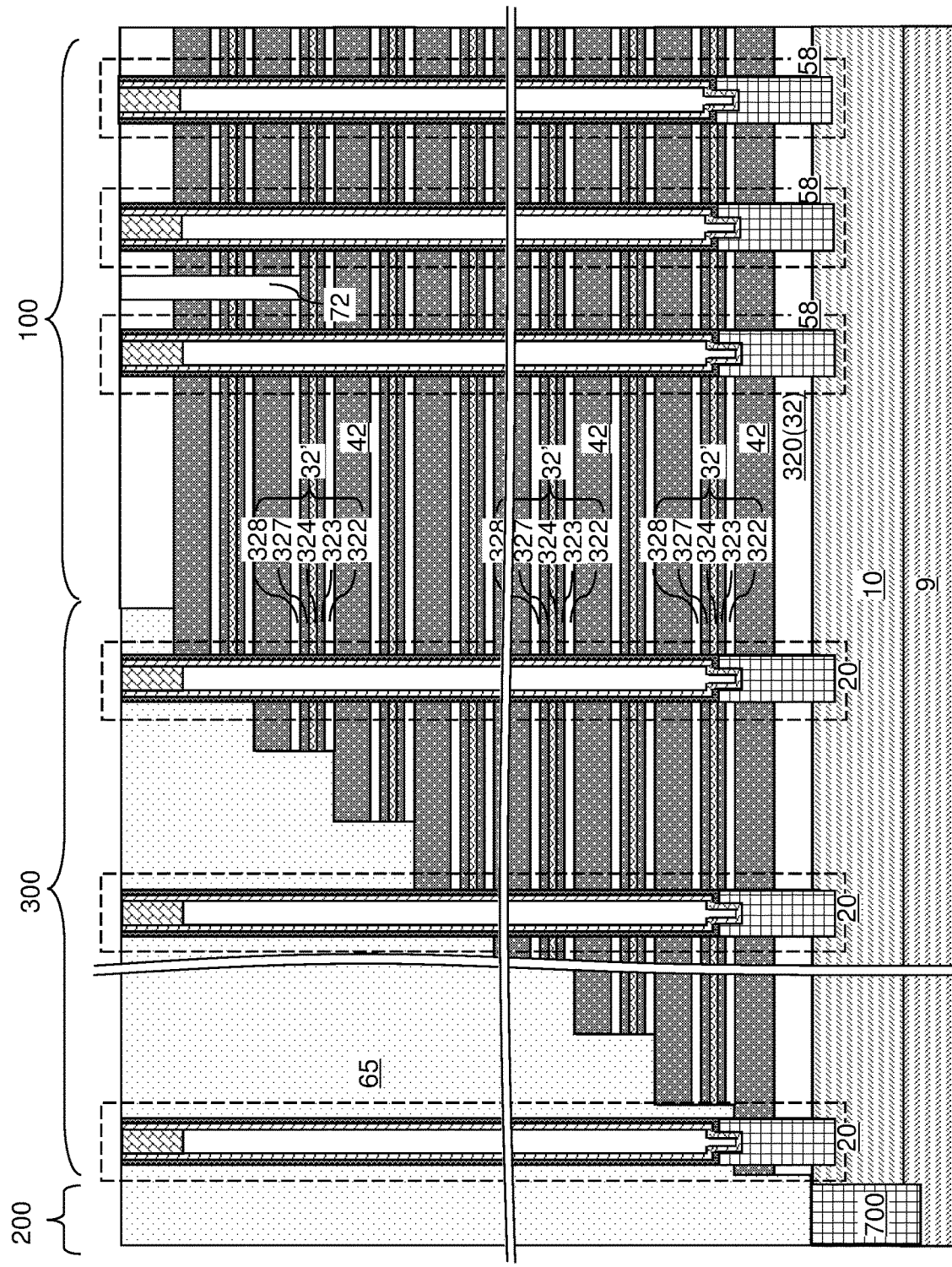
FIG. 6 is a schematic vertical cross-sectional view of the exemplary structure after formation of memory opening fill structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60 and a vertical stack of charge storage regions laterally surrounding the dielectric material liner 56 (as embodied as memory material layer 54C) and an optional blocking dielectric layer 52C. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
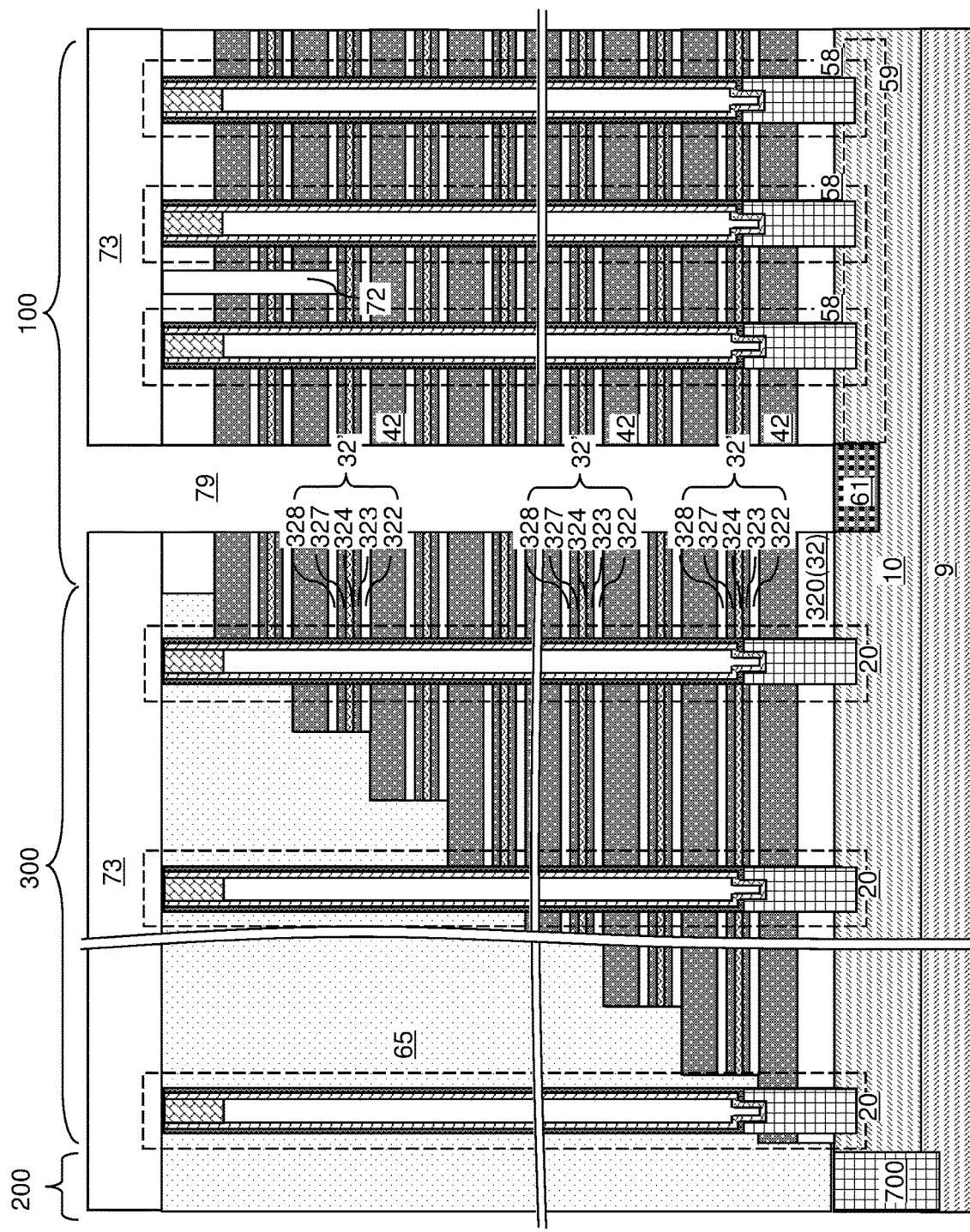
FIG. 7A is a schematic vertical cross-sectional view of the exemplary structure after formation of backside trenches according to an embodiment of the present disclosure.
Figure 7B:
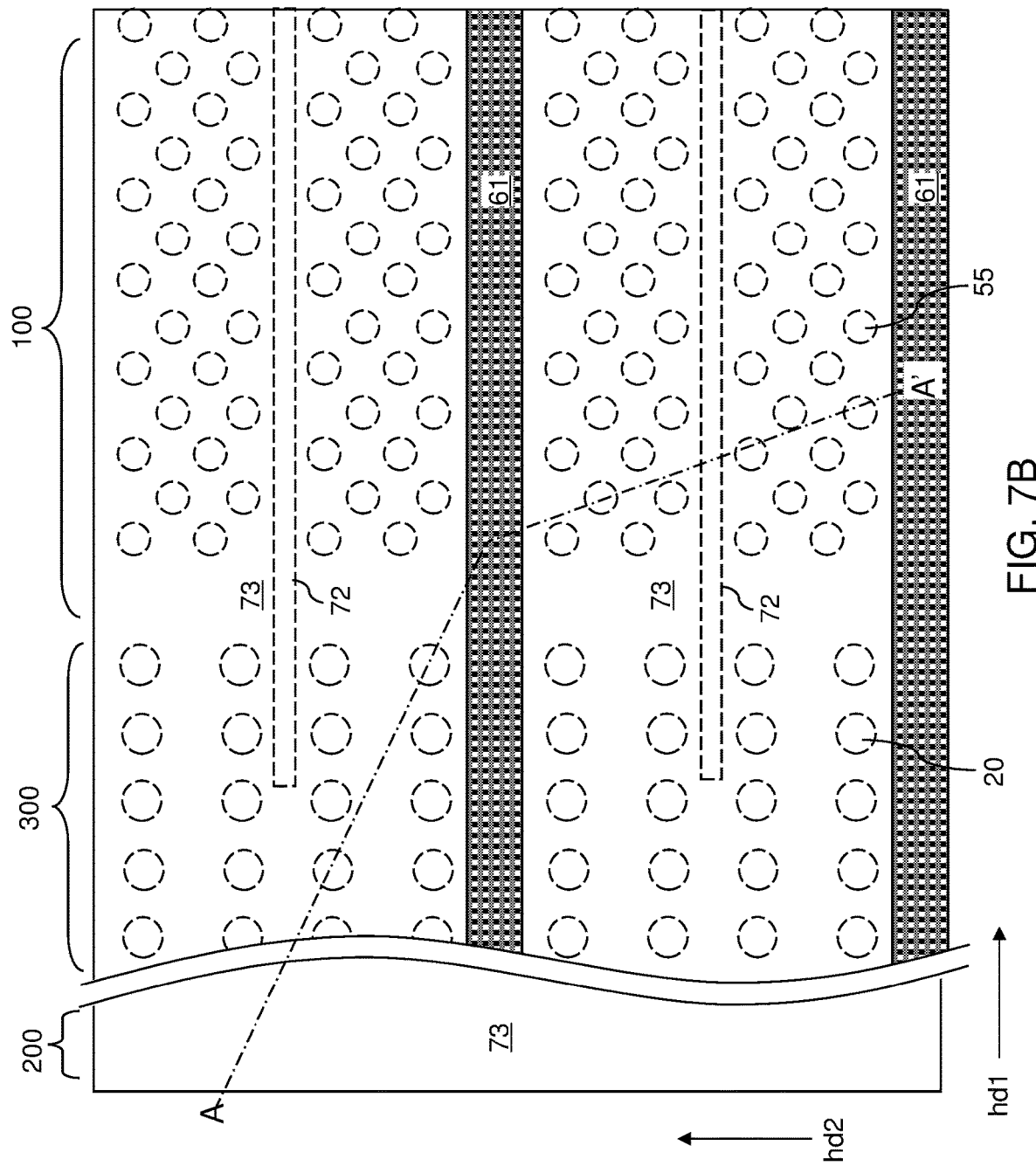
FIG. 7B is a partial see-through top-down view of the exemplary structure of FIG. 7A. The vertical plane A-A' is the plane of the schematic vertical cross-sectional view of FIG. 7A.
Figure 7C:
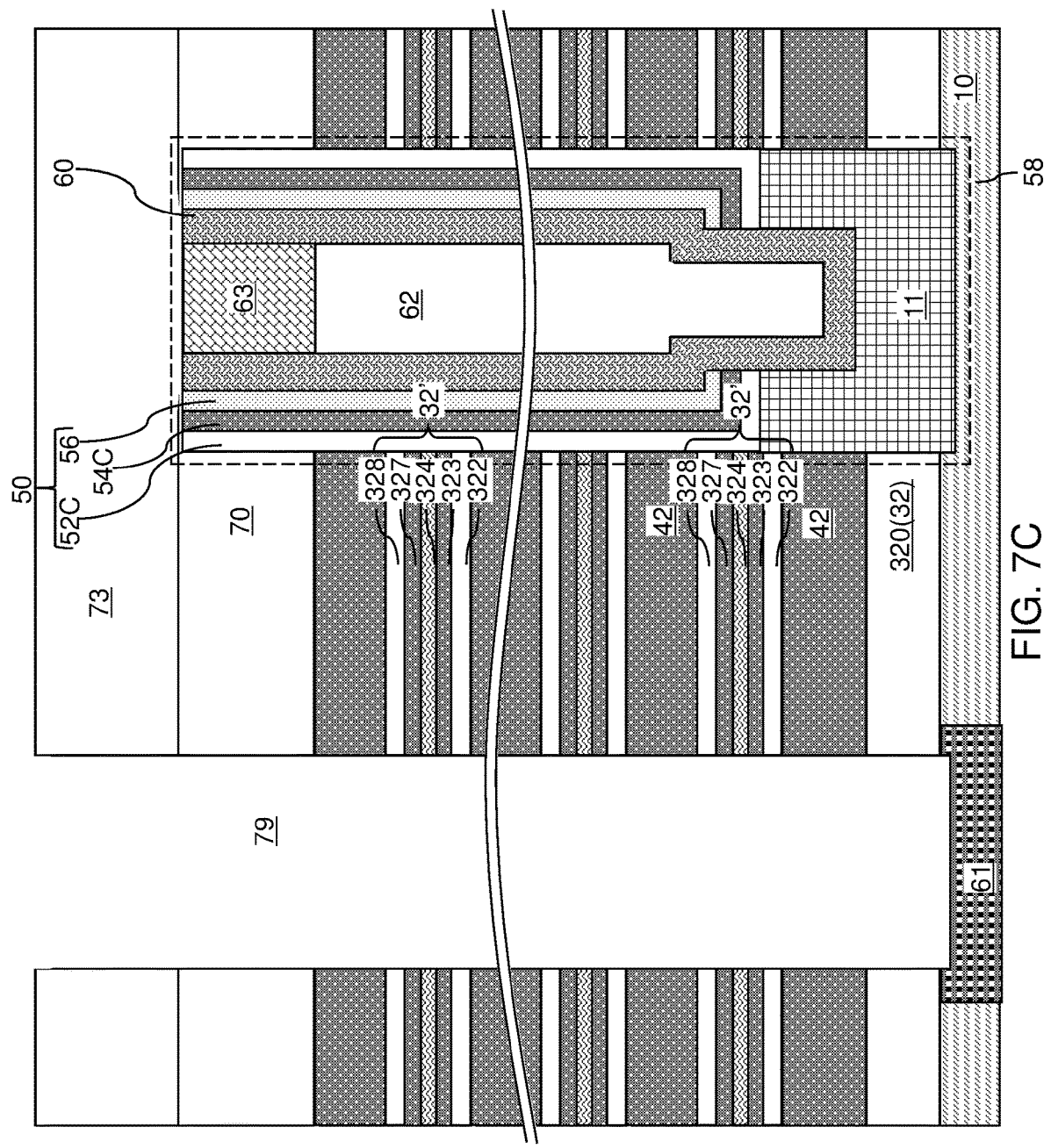
FIG. 7C is a magnified view of a region of the exemplary structure of FIG. 7A that includes a memory opening fill structure and a backside trench.

Referring to FIGS. 7A-7C, a contact-level dielectric layer 73 can be formed over the vertical repetition of the unit layer stack (32', 42) of in-process spacer-level layer stacks 32' and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the vertical repetition of the unit layer stack (32', 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 73 and the vertical repetition of the unit layer stack (32', 42). The vertical repetition of the unit layer stack (32', 42) as formed at the processing steps of FIG. 3 is divided into multiple vertical repetitions of a respective unit layer stack (32', 42) that are laterally spaced apart along the second horizontal direction hd2 by the backside trenches 79. Layer stacks (320, 32', 42, 70, 73) are formed, each of which includes a respective patterned portion of the contact-level dielectric layer 73 and a respective patterned portion of the vertical repetition of the unit layer stack (32', 42) as formed at the processing steps of FIG. 3 and laterally spaced by the backside trenches 79.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of vertical NAND strings. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11. Alternatively, a horizontal semiconductor source strap (e.g., direct strap contact) may be formed in contact with a sidewall of the vertical semiconductor channel 60 in place of the source region 61 and the horizontal semiconductor channel 59.

Figure 8:
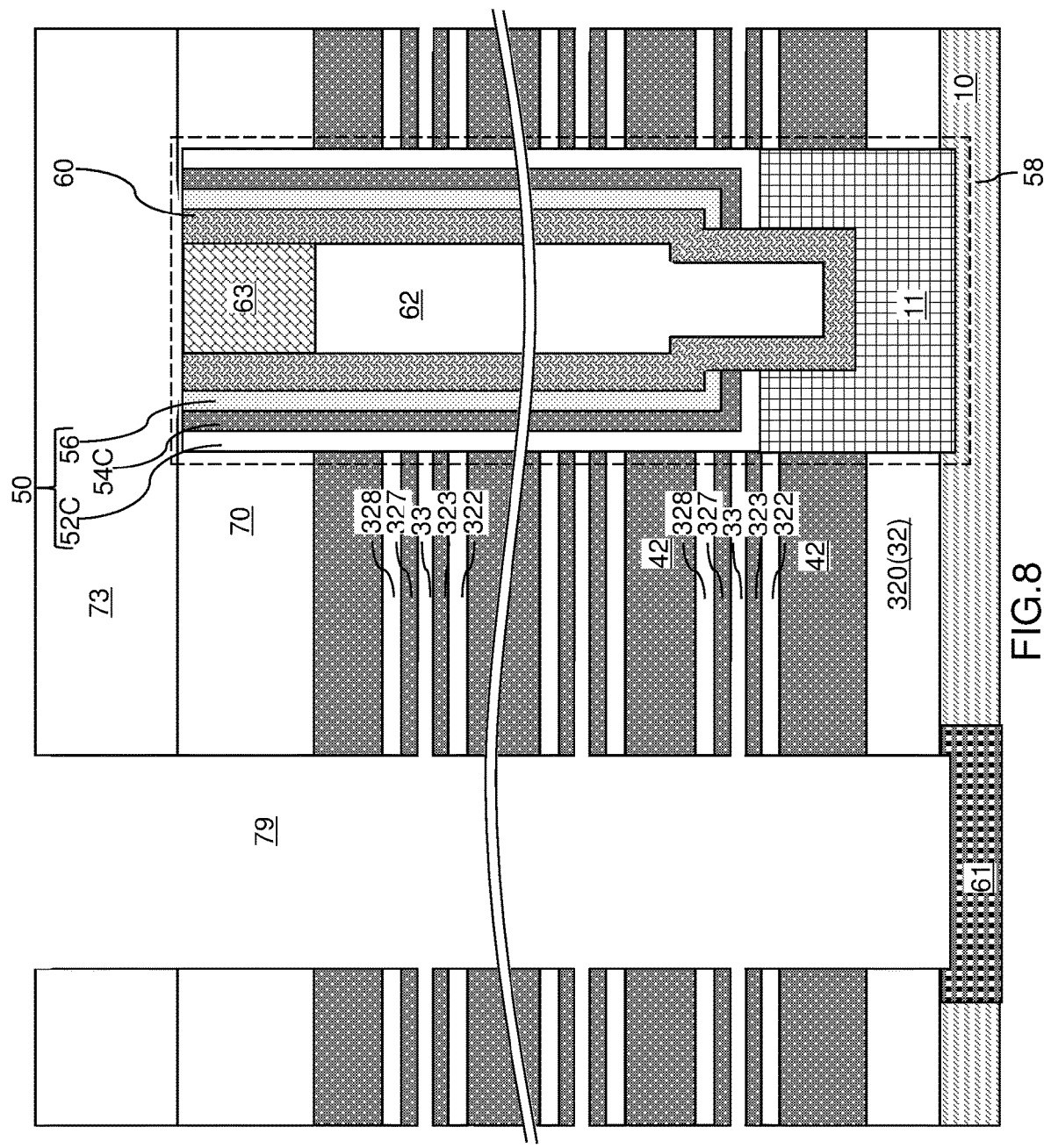
FIG. 8 is a schematic vertical cross-sectional view of a region of the exemplary structure after formation of insulating-level backside recesses according to an embodiment of the present disclosure.

Referring to FIG. 8, insulating-level backside recesses 33 are formed by removing the disposable material sublayers 324 selective to materials of the sacrificial material layers 42, the lower insulating sublayers 322, the first spacer-level sacrificial sublayers 323, the second spacer-level sacrificial sublayers 327, and the upper insulating sublayers 328 by performing a first isotropic etch process. The first isotropic etch process may comprise a wet etch process, a dry etch process, or an ashing process. For example, if the disposable material sublayers 324 comprise a silicon-germanium alloy or germanium, a wet etch process employing a combination of dilute hydrofluoric acid and hydrogen peroxide, hot trimethyl-2 hydroxyethyl ammonium hydroxide ("hot TMY"), or tetramethyl ammonium hydroxide (TMAH) may be employed. If the disposable material sublayers 324 comprise porous silicon nitride, a wet etch process employing dilute hydrofluoric acid may be employed. If the disposable material sublayers 324 comprise amorphous carbon or diamond-like carbon (DLC), an ashing process may be employed. In one embodiment, the first isotropic etch process may be selective to the material of the blocking dielectric layers 52C. Annular surface segments of each blocking dielectric layer 52C are physically exposed to the insulating-level backside recesses 33.

Figure 9:
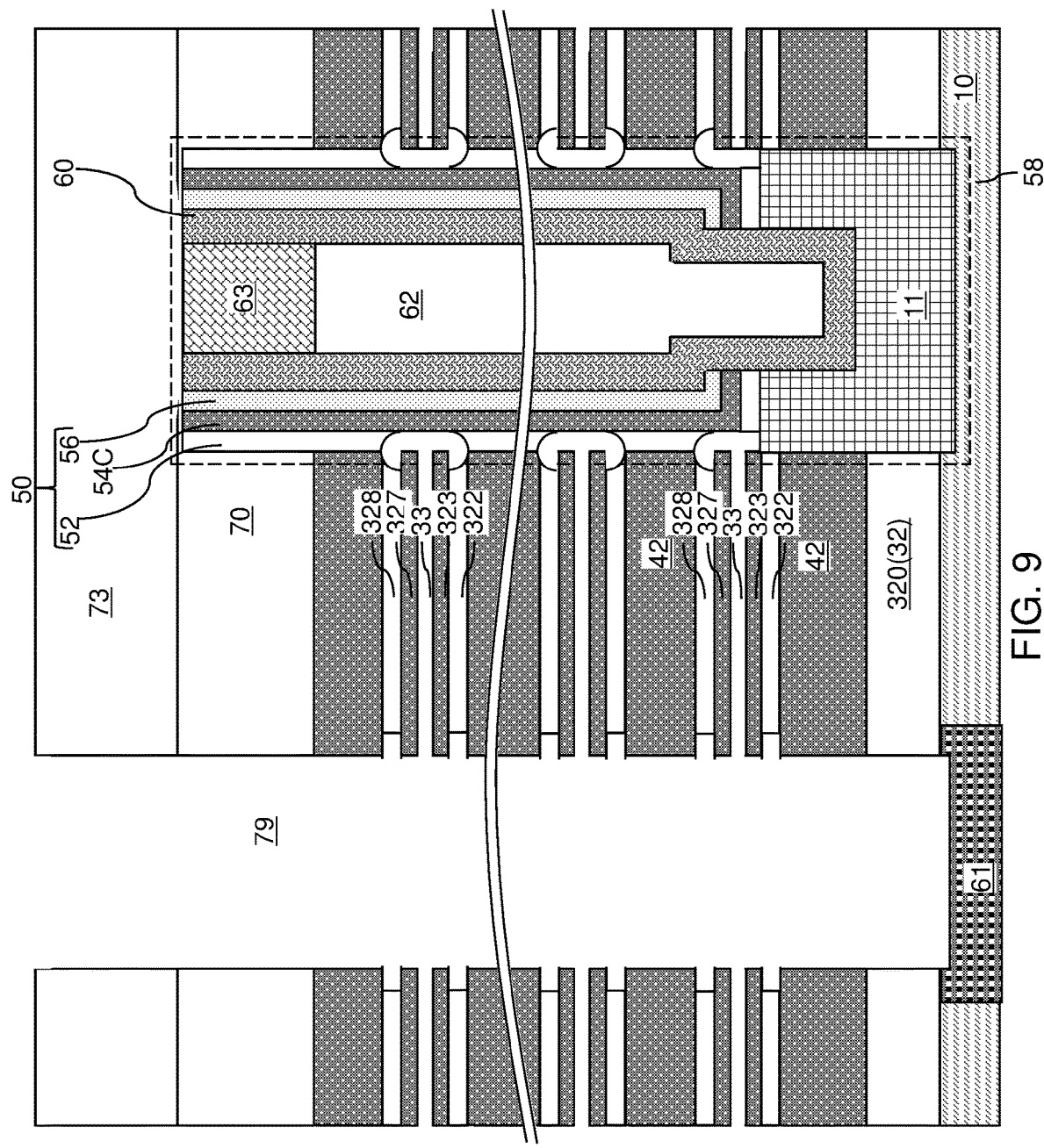
FIG. 9 is a schematic vertical cross-sectional view of a region of the exemplary structure after formation of a vertical stack of blocking dielectric portions according to an embodiment of the present disclosure.

Referring to FIG. 9, in case the first isotropic etch process is selective to the material of the blocking dielectric layers 52C, a supplemental isotropic etch process can be performed to isotropically etch physically exposed surface portions of the blocking dielectric layers 52C that are exposed to the insulating-level backside recesses 33. The chemistry of the supplemental isotropic etch process may be selected such that the supplemental isotropic etch process etches portions of the blocking dielectric layers 52C that are proximal to the insulating-level backside recesses 33 selective to the material of the memory material layers 54C. For example, if the memory material layers 54C include high density (i.e., low porosity) silicon nitride and if the blocking dielectric layers 52C comprise silicon oxide, the supplemental isotropic etch process may comprise a wet etch process employing dilute hydrofluoric acid. In this case, the lower insulating sublayers 322 and the upper insulating sublayers 328 may comprise a silicon oxide material (such as undoped silicate glass), and may be collaterally recessed during the supplemental isotropic etch process.

Each blocking dielectric layer 52C may be divided into a vertical stack of blocking dielectric portions 52 by the supplemental isotropic etch process. In one embodiment, each blocking dielectric portion 52 within a vertical stack of blocking dielectric portions 52 other than a topmost blocking dielectric portion 52 may comprise an upper annular concave surface and a lower annular concave surface that are physically exposed to the insulating-level backside recesses 33 as expanded by the supplemental isotropic etch process. Further, each sidewall of the lower insulating sublayers 322 and the upper insulating sublayers 328 that faces a respective one of the memory opening fill structures 58 can be isotropically etched to form a respective annular concave sidewall that is exposed to a respective one of the insulating-level backside recesses 33 as expanded by the supplemental isotropic etch process. Further, sidewalls of the lower insulating sublayers 322 and the upper insulating sublayers 328 that are physically exposed to the backside trenches 79 may be collaterally recessed during the supplemental isotropic etch process. Generally, each of the blocking dielectric portions 52 comprises at least one concave annular surface that is physically exposed to the insulating-level backside recesses 33.

Figure 10:
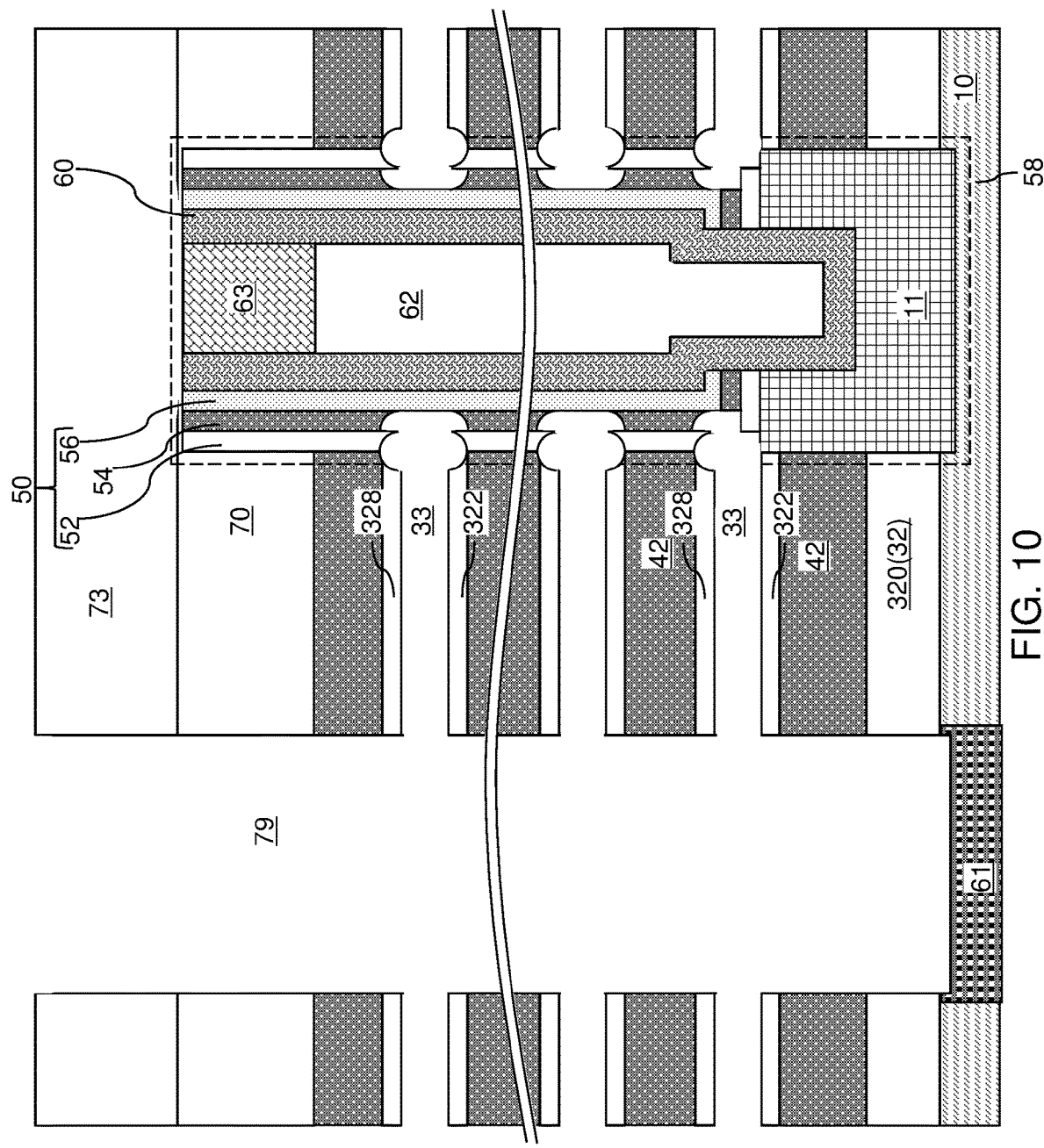
FIG. 10 is a schematic vertical cross-sectional view of a region of the exemplary structure after formation of a vertical stack of memory elements and removal of spacer-level sacrificial sublayers according to an embodiment of the present disclosure.

Referring to FIG. 10, the first spacer-level sacrificial sublayers 323 and the second spacer-level sacrificial sublayers 327 can be removed selective to the lower insulating sublayers 322 and the upper insulating sublayers 328 employing a second isotropic etch process. In other words, the second isotropic etch process has an etch chemistry that etches the materials of the first spacer-level sacrificial sublayers 323 and the second spacer-level sacrificial sublayers 327 selective to the materials of the sacrificial material layers 42, the lower insulating sublayers 322 and the upper insulating sublayers 328. In an illustrative example, if the first spacer-level sacrificial sublayers 323 and the second spacer-level sacrificial sublayers 327 comprise low density silicon nitride, a wet etch process employing hot phosphoric acid or dilute hydrofluoric acid may be performed. In another illustrative example, if the first spacer-level sacrificial sublayers 323 and the second spacer-level sacrificial sublayers 327 comprise silicon-germanium or germanium, a wet etch process employing a mixture of dilute hydrofluoric acid and hydrogen peroxide may be performed. The insulating-level backside recesses 33 are expanded in volume by the second isotropic etch process.

Generally, the memory material layers 54C and the sacrificial material layers 42 may include a same material or different materials. In one embodiment, the second isotropic etch process employs an etch chemistry that etches the material of the memory material layers 54C concurrently with etching of the materials of the first spacer-level sacrificial sublayers 323 and the second spacer-level sacrificial sublayers 327 selective to the material of the dielectric material liners 56. If the memory material layers 54C and the sacrificial material layers 42 comprise the same material (e.g., high density silicon nitride), the memory material layers 54C and the sacrificial material layers 42 may be removed at the same etch rate during the second isotropic etch process and the sacrificial material layers 42 are recessed from the backside trenches 79 during this step. If the memory material layers 54C and the sacrificial material layers 42 comprise different materials, the memory material layers 54C and the sacrificial material layers 42 may be removed at different etch rates during the second isotropic etch process. A vertical stack of discrete (i.e., vertically separated) memory elements 54 can be formed around each of the vertical semiconductor channels 60. The vertical stack of discrete memory elements 54 comprises a vertical stack of memory material portions including remaining portions of a respective one of the memory material layers 54C.

Alternatively, in case the memory material layers 54C and the sacrificial material layers 42 comprise different materials and the second isotropic etch process does not provide a significant etch rate for the material of the memory material layers 54C, a supplemental isotropic etch process may be performed prior to, or after, the second isotropic etch process to isotropically etch the material of the memory material layers 54C around each insulating-level backside recesses 33. A vertical stack of memory elements 54 can be formed around each of the vertical semiconductor channels 60 by the supplemental etch process.

Each memory element 54 located between a vertically neighboring pair of insulating-level backside recesses 33 can comprise a respective upper concave annular surface and a respective lower concave annular surface. Each memory element 54 located between a vertically neighboring pair of insulating-level backside recesses 33 can comprise an inner cylindrical sidewall, an outer cylindrical sidewall, an upper concave annular surface that connects top edges of the inner cylindrical sidewall and the outer cylindrical sidewall, and a lower concave annular surface that connects bottom edges of the inner cylindrical sidewall and the outer cylindrical sidewall.

Generally, physically exposed surface portions of the memory material layers 54C can be isotropically etched by the second isotropic etch process or by the supplemental isotropic etch process. Each of the memory material layers 54C is divided into a respective vertical stack of memory elements 54 (i.e., memory material portions) employing the second anisotropic etch process, or employing an additional isotropic etch process after the first isotropic etch process and prior to, or after, the second isotropic etch process. The sacrificial material layers 42, the lower insulating sublayers 322 and the upper insulating sublayers 328 remain to provide structural support for the device.

Generally, a memory opening fill structure 58 can be located in each memory opening 49. The memory opening fill structure 58 comprises a vertical semiconductor channel 60, a dielectric material liner 56 laterally surrounding the vertical semiconductor channel 60, and a vertical stack of discrete memory elements 54 laterally surrounding the dielectric material liner 56.

Figure 11:
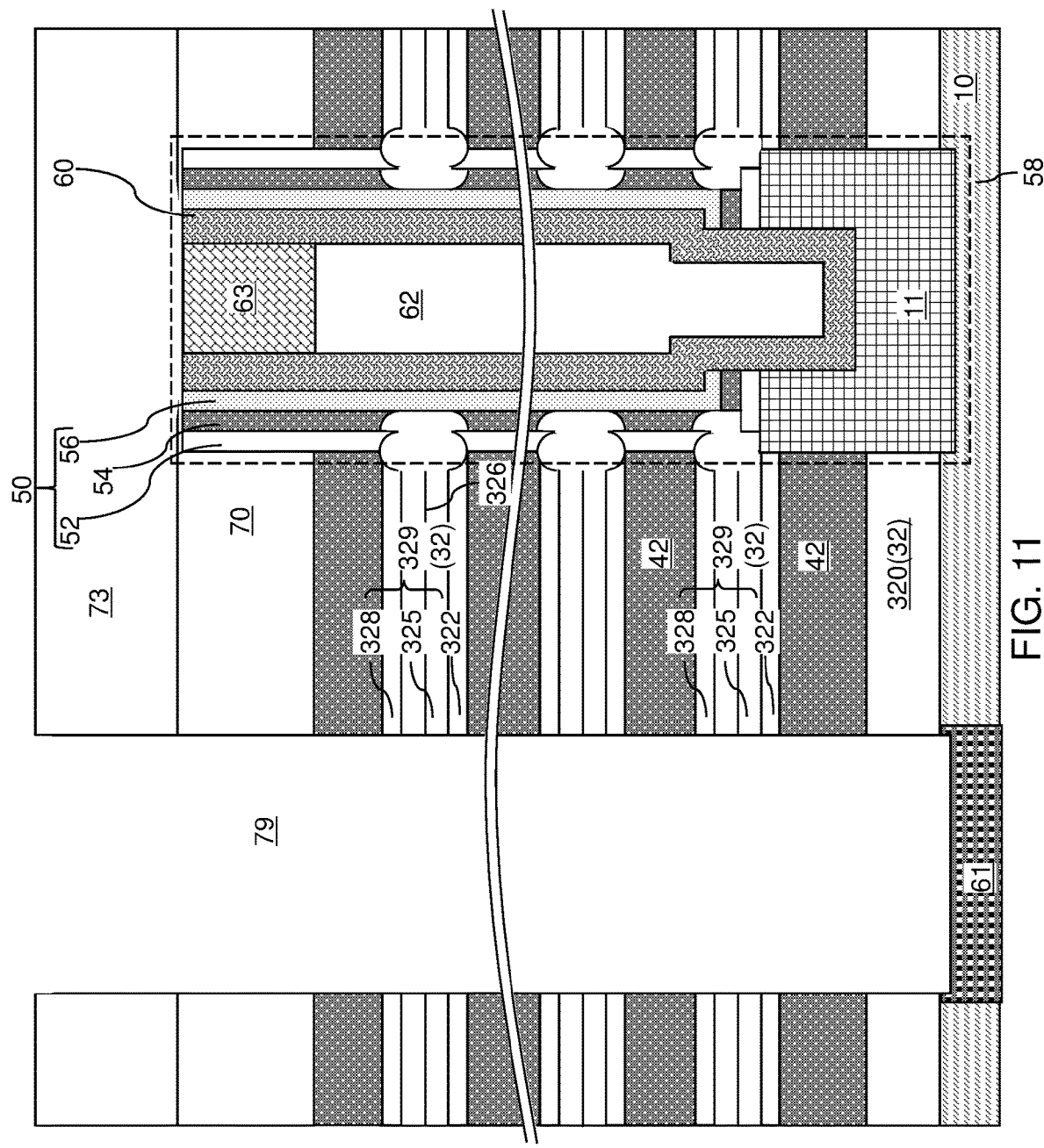
FIG. 11 is a schematic vertical cross-sectional view of a region of the exemplary structure after formation of center insulating sublayers according to an embodiment of the present disclosure.

Referring to FIG. 11, an insulating material can be conformally deposited within each of the insulating-level backside recesses 33 by a conformal deposition process such as an atomic layer deposition process or a low pressure chemical vapor deposition process. The insulating material may be the same as, or may be different from, the materials of the lower insulating sublayers 322 and the upper insulating sublayers 328. For example, the insulating material may comprise undoped silicate glass, a doped silicate glass (such as borophosphosilicate glass, borosilicate glass, phosphosilicate glass, or fluorosilicate glass), an organosilicate glass, or another dielectric material. An etch-back process employing an isotropic etch process, an anisotropic etch process, or a combination thereof can be performed to remove portions of the insulating material that are deposited inside the backside trenches 79 and above the contact-level dielectric layer 73. Each remaining portion of the deposited insulating material that fills a respective one of the insulating-level backside recesses 33 constitutes a dielectric material layer, which is herein referred to as a center insulating sublayer 325. Each center insulating sublayer 325 may have a horizontally-extending seam 326 that laterally surrounds each memory opening fill structure 58 located between a neighboring pair of backside trenches 79.

Generally, center insulating sublayers 325 can be deposited within the insulating-level backside recesses 33. Each contiguous combination of a lower insulating sublayer 322, an upper insulating sublayer 328, and a center insulating sublayer 325 constitutes a composite insulating layer 329, which is one of the insulating layers 32. An alternating stack of composite insulating layers 329 and the sacrificial material layers 42 is formed.

In one embodiment, the center insulating sublayers 325 are formed directly on the dielectric material liners 56 and the memory material portions (i.e., the memory elements 54) which are remaining portions of the memory material layers 54C. In one embodiment, each of the center insulating sublayer 325 contacts a respective annular segment of an outer sidewall of the dielectric material liner 56. In one embodiment, each center insulating sublayer 325 other than a topmost one and a bottommost one among the center insulating sublayers 325 may contact an annular concave bottom surface of a respective overlying one among the discrete memory elements 54, and contact an annular concave top surface of a respective underlying one among the discrete memory elements 54, such that the center insulating sublayer 325 separates vertically adjacent discrete memory elements 54. Generally, each of the blocking dielectric portions 52 comprises at least one concave annular surface that contacts a respective one of the center insulating sublayers 325 and laterally surrounds a respective vertical semiconductor channel 60.

In one embodiment, each vertical stack of blocking dielectric portions 52 can be located at levels of the sacrificial material layers 42, and can contact an outer sidewall of a respective one of the discrete memory elements 54. In one embodiment, each of the center insulating sublayers 325 contacts a respective one of the blocking dielectric portions 52. In one embodiment, each of the blocking dielectric portions 52 comprises at least one concave annular surface that contacts a respective one of the center insulating sublayers 325 and laterally surrounds the vertical semiconductor channel 60. In one embodiment, a subset of the center insulating sublayers 525 contacts a concave annular bottom surface of a respective overlying blocking dielectric portion 52 and a concave annular top surface of a respective underlying blocking dielectric portion 52.

The insulating layers 32 comprise the bottommost insulating layer 320 and the composite insulating layers 329. Thus, a subset of the insulating layers 32 comprises a respective contiguous set of a lower insulating sublayer 322, an upper insulating sublayer 328 overlying the lower insulating sublayer 322, and a center insulating sublayer 325 located between and in contact with the lower insulating sublayer 322 and the upper insulating sublayer 328.

In one embodiment, the center insulating sublayer 325 comprises a horizontal top surface contacting a horizontal bottom surface of the upper insulating sublayer 328, and a horizontal bottom surface contacting a horizontal top surface of the lower insulating sublayer 322.

In one embodiment, each center insulating sublayer 325 (other than the top one) comprises an upper annular convex surface contacting an annular concave surface of the upper insulating sublayer 328, and a lower annular convex surface contacting an annular concave surface of the lower insulating sublayer 322.

In one embodiment, each of the center insulating sublayers 325 comprises a respective continuous horizontal seam 326 that laterally surrounds each memory opening fill structure 58 located between a neighboring pair of backside trenches 79 and is laterally spaced from an outer sidewall of the dielectric material liner 56.

In one embodiment, each of the upper insulating sublayers 328 and the lower insulating sublayers 322 is laterally offset outward from the memory opening fill structures 58 by vertically-bulging annular portions of the center insulating sublayers 325, which include the regions of the center insulating sublayers 325 that contact the concave annular surfaces of the upper insulating sublayers 328 and the lower insulating sublayers 322.

Figure 12:
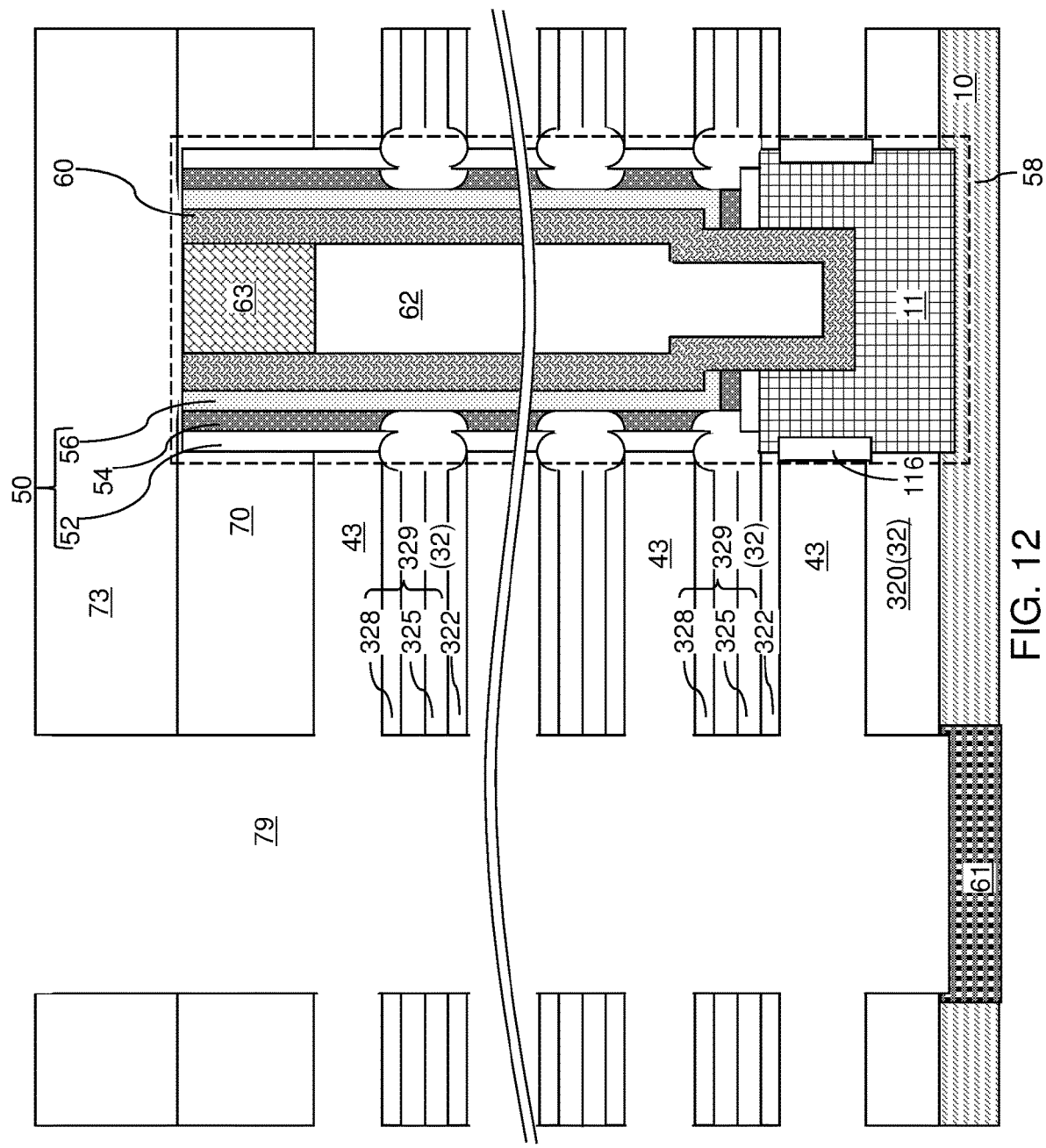
FIG. 12 is a schematic vertical cross-sectional view of a region of the exemplary structure after formation of backside recesses according to an embodiment of the present disclosure.

Referring to FIG. 12, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Generally, the backside recesses 43 can be formed by removing the sacrificial material layers 42 selective to the insulating layers 32.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 13:
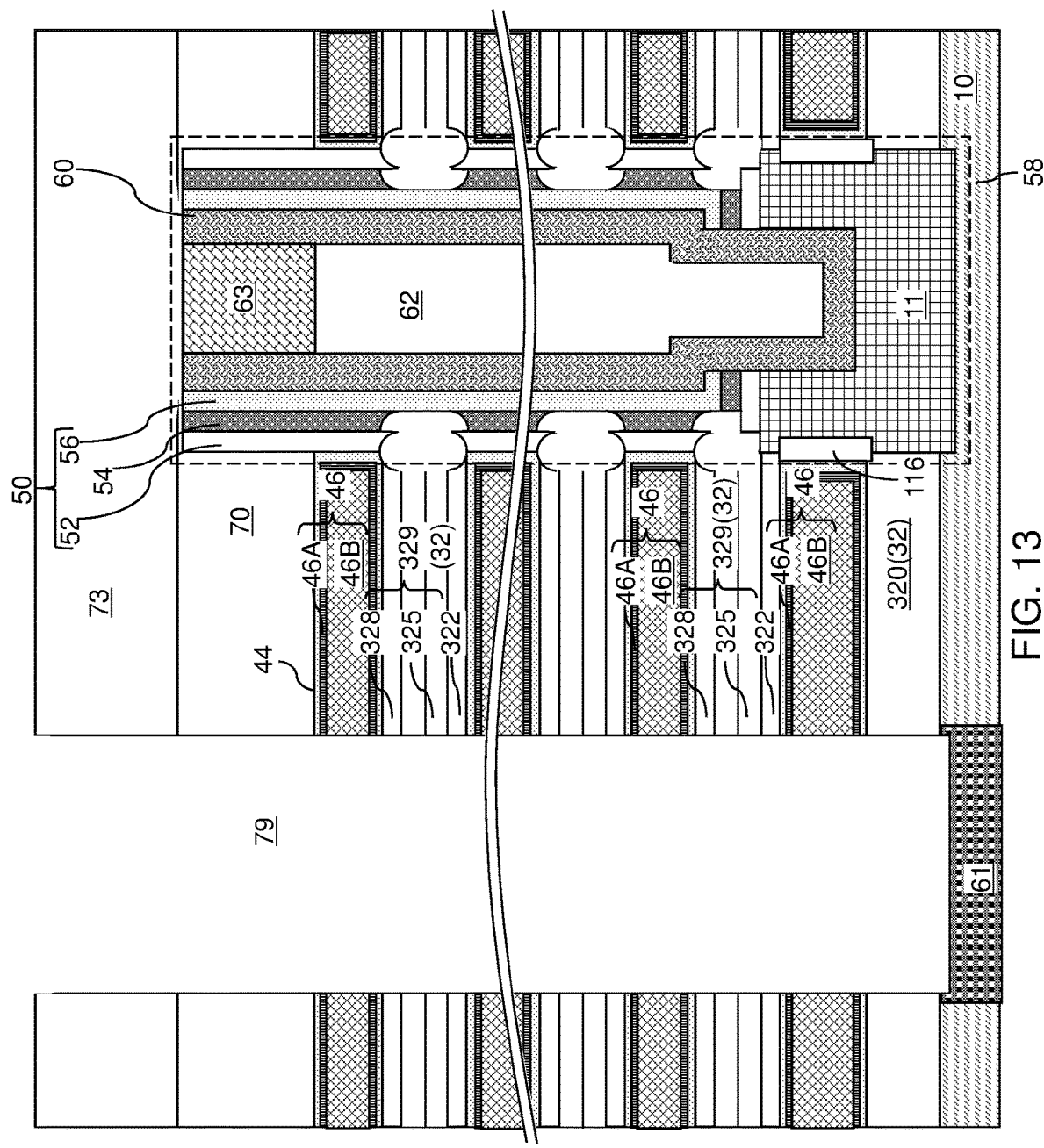
FIG. 13 is a schematic vertical cross-sectional view of a region of the exemplary structure after formation of backside blocking dielectric layers and electrically conductive layers according to an embodiment of the present disclosure.

Referring to FIG. 13, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52C is present within each memory opening, the backside blocking dielectric layer 44 is optional. In case the blocking dielectric layer 52C is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed. Alternatively or additionally, the backside blocking dielectric layer 44 can include a silicon oxide layer.

The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

At least one metallic material can be deposited in the remaining volumes of the backside recesses 43. For example, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material can be deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer (which is a temporary structure and is not illustrated) can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of insulating material layers such as a vertically neighboring pair of insulating layers 32.

Each sacrificial material layer 42 can be replaced with an electrically conductive layer 46. A backside cavity is present in each backside trench 79 that is not filled with the continuous metallic material layer. A tubular dielectric spacer 116 laterally surrounds a pedestal channel portion 11. A bottommost electrically conductive layer 46 laterally surrounds each tubular dielectric spacer 116 upon formation of the electrically conductive layers 46.

The continuous electrically conductive material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

The planar dielectric portions 616 can be removed during removal of the continuous electrically conductive material layer. A backside cavity 79' is present within each backside trench 79. The first, second, and third sacrificial material layers (423, 425, 427) are replaced with the electrically conductive layers 46.

Figure 14:
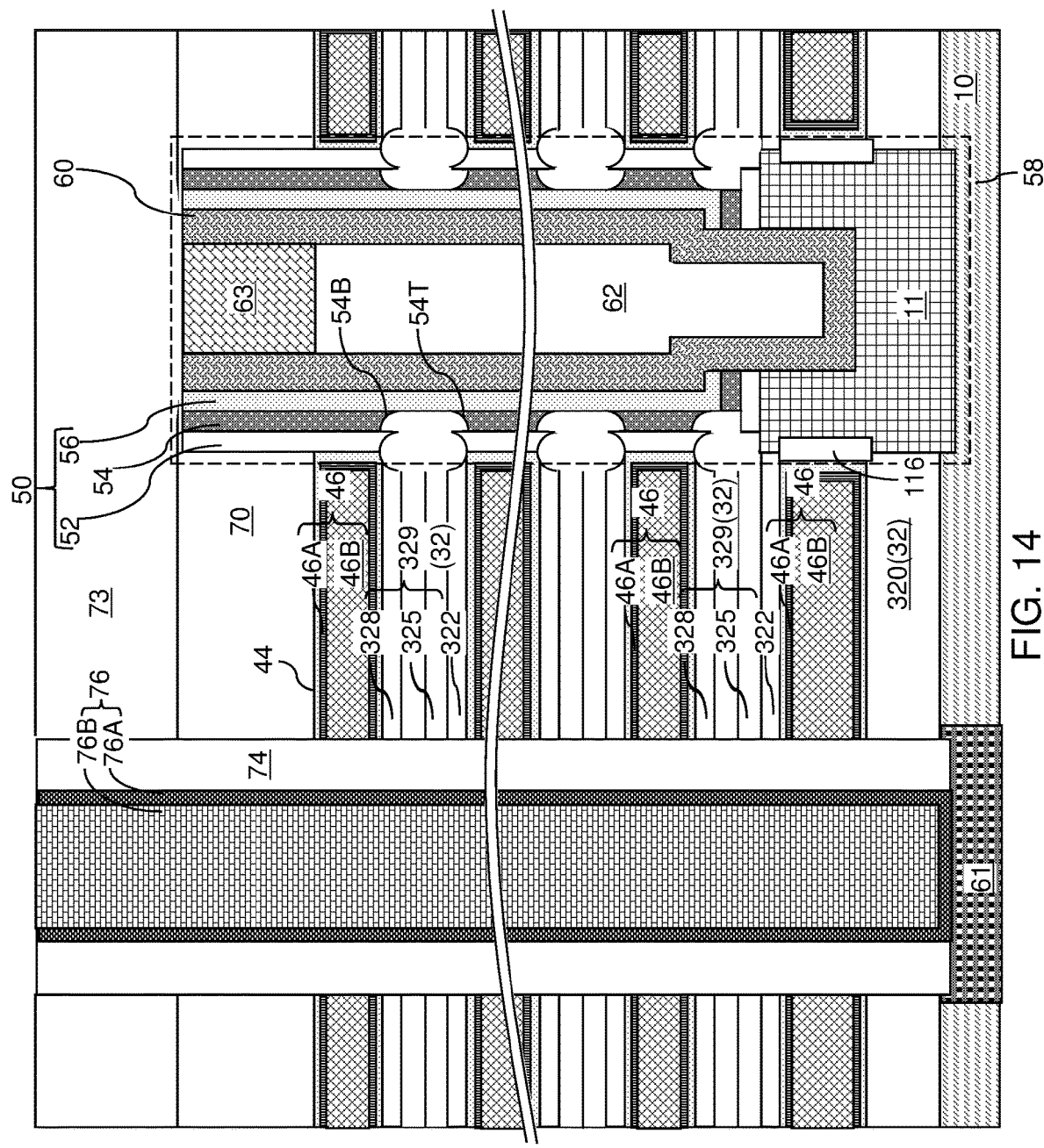
FIG. 14 is a schematic vertical cross-sectional view of a region of the exemplary structure after formation of an insulating spacer and a backside contact structure according to an embodiment of the present disclosure.

Referring to FIG. 14, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 15A:
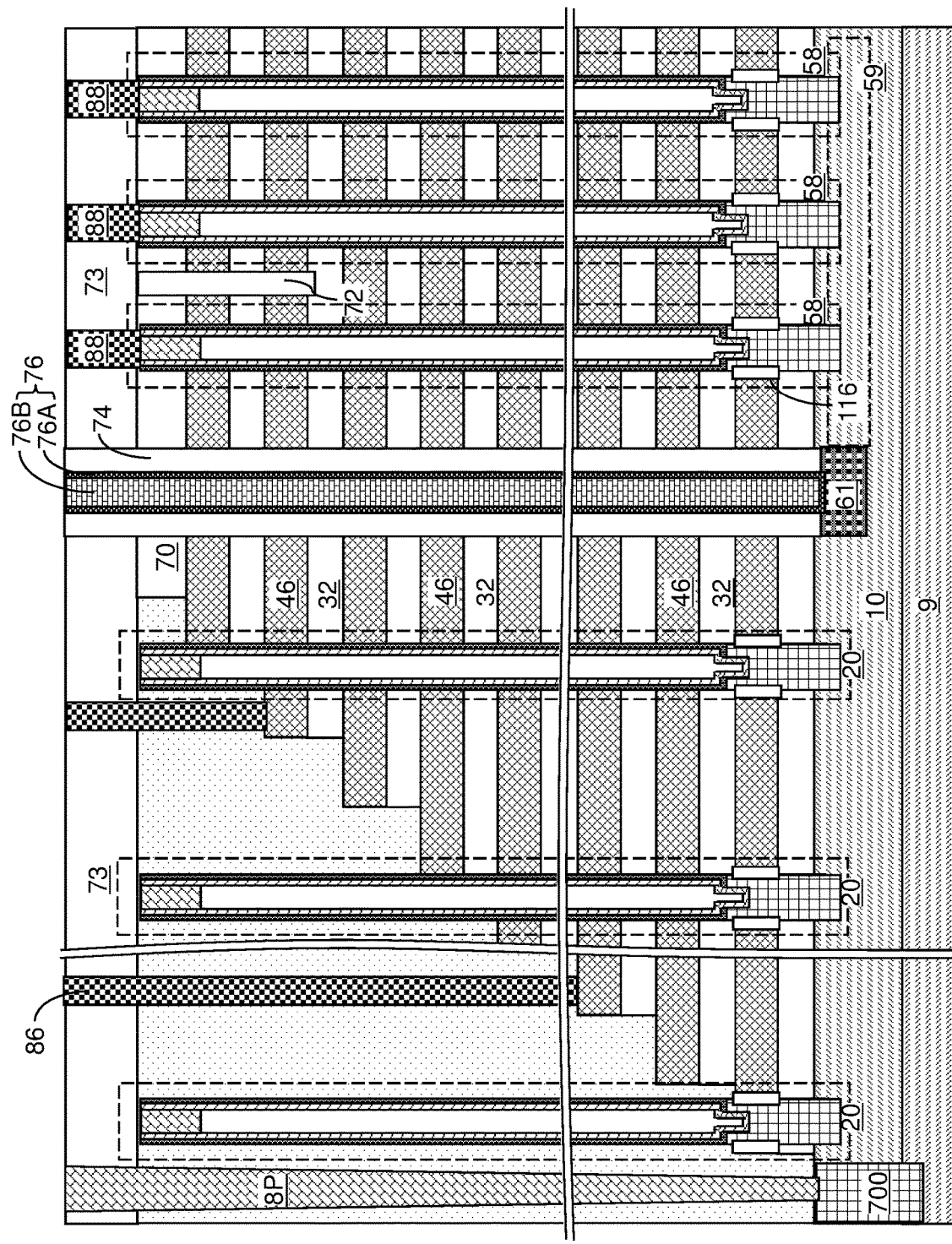
FIG. 15A is a schematic vertical cross-sectional view of the exemplary structure after formation of additional contact via structures according to an embodiment of the present disclosure.
Figure 15B:
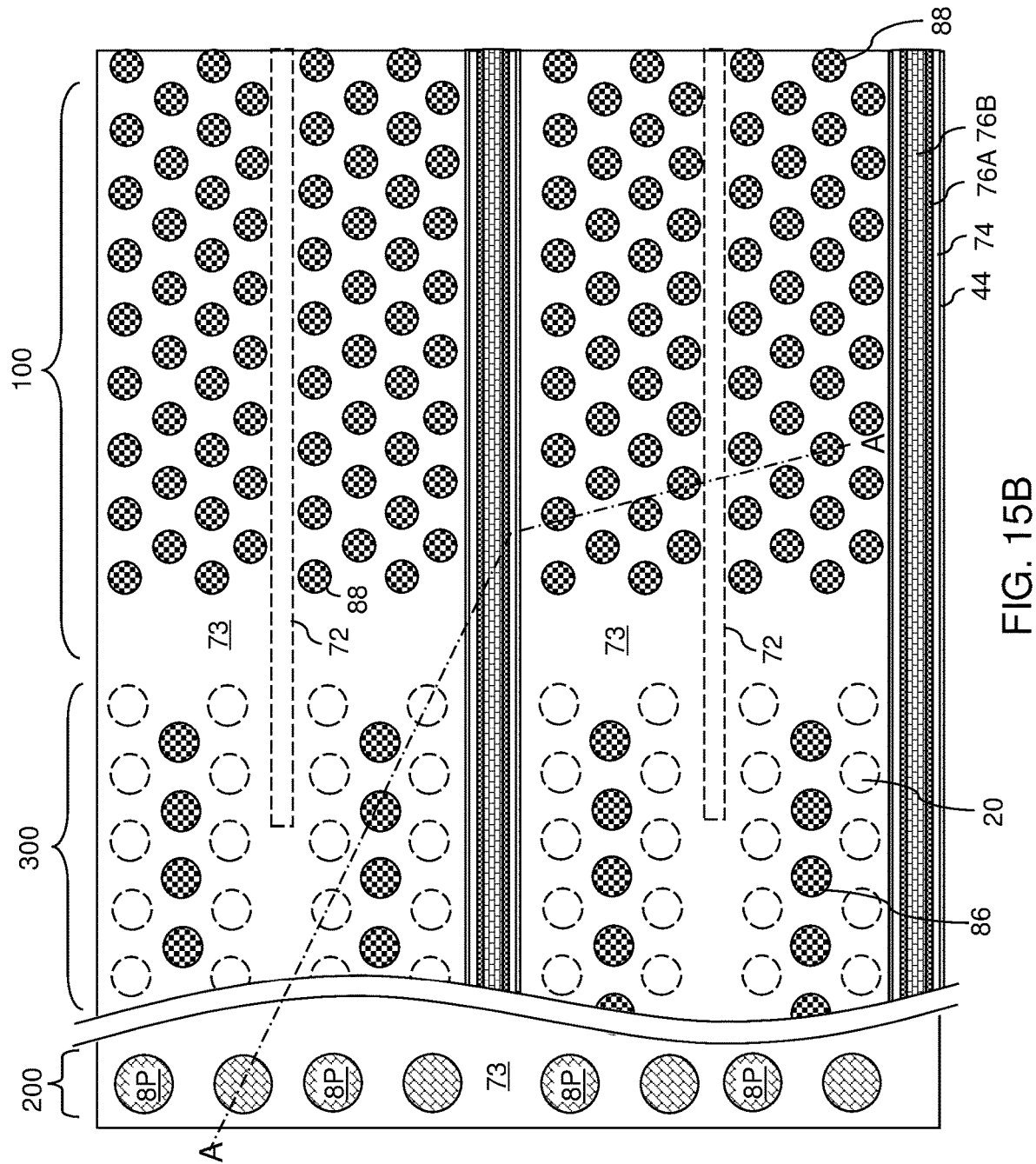
FIG. 15B is a top-down view of the exemplary structure of FIG. 15A. The vertical plane A-A' is the plane of the schematic vertical cross-sectional view of FIG. 15A.

Referring to FIGS. 15A and 15B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings and according to various embodiments of the present disclosure, a memory device comprises an alternating stack of insulating layers 32 and electrically conductive layers 46; a memory opening 49 vertically extending through the alternating stack (32, 46); and a memory opening fill structure 58 located in the memory opening 49 and comprising a vertical semiconductor channel 60, a dielectric material liner 56 laterally surrounding the vertical semiconductor channel 60, and a vertical stack of discrete memory elements 54 laterally surrounding the dielectric material liner 56. A subset of the insulating layers 32 comprises a respective contiguous set of a lower insulating sublayer 322, an upper insulating sublayer 328 overlying the lower insulating sublayer 322, and a center insulating sublayer 325 located between and in contact with the lower insulating sublayer 322 and the upper insulating sublayer 328. As shown in FIG. 14, the center insulating sublayer 325 in the subset of insulating layers 32 (e.g., each center insulating sublayer in FIG. 14 other than a bottommost center insulating sublayer 325) contacts an annular concave bottom surface 54B of a respective overlying discrete memory element 54, and contacts an annular concave top surface 54T of a respective underlying discrete memory element 54.

The material compositions of the lower insulating sublayer 322 and the upper insulating sublayer 328 may be the same as, or may be different from, the material composition of the center insulating sublayer 325. In one embodiment, each of the lower insulating sublayer 322, the upper insulating sublayer 328, the center insulating sublayer 325 may be a silicon oxide material layer including different dopants (such as B, P, F, As, C, and/or H) or different concentrations of dopants therein. In one embodiment, each of the center insulating sublayers 325 contacts a respective annular segment of an outer sidewall of the dielectric material liner 56.

In one embodiment, the memory opening fill structure 58 comprises a vertical stack of blocking dielectric portions 52 located at levels of the electrically conductive layers 46 and contacting an outer sidewall of a respective one of the discrete memory elements 54; and each of the center insulating sublayers 325 contacts a respective one of the blocking dielectric portions 52. In one embodiment, each of the blocking dielectric portions 52 comprises at least one concave annular surface that contacts a respective one of the center insulating sublayers 325 and laterally surrounds the vertical semiconductor channel 60.

In one embodiment, the center insulating sublayer 325 comprises: a horizontal top surface contacting a horizontal bottom surface of the upper insulating sublayer 328; and a horizontal bottom surface contacting a horizontal top surface of the lower insulating sublayer 322. In one embodiment, the center insulating sublayer 325 comprises: an upper annular convex surface contacting an annular concave surface of the upper insulating sublayer 328; and a lower annular convex surface contacting an annular concave surface of the lower insulating sublayer 322.

In one embodiment, each of the blocking dielectric portions 52 comprises a silicon oxide material, and each of the discrete memory elements 54 comprises a charge storage dielectric material such as silicon nitride.

In one embodiment, each of the center insulating sublayers 325 comprises a respective continuous horizontal seam that laterally surrounds the memory opening fill structure 58 and is laterally spaced from an outer sidewall of the dielectric material liner 56. In one embodiment, each of the upper insulating sublayers 328 and the lower insulating sublayers 322 is laterally offset outward from the memory opening fill structure 58 by vertically-bulging annular portions of the center insulating sublayers 325.

In one embodiment, the vertical stack of discrete memory elements 54 comprises a vertical stack of discrete charge storage elements, and the dielectric material liner 56 comprises a tunneling dielectric layer.

In one embodiment, the memory device comprises additional memory openings 49 vertically extending through the alternating stack (32, 46), and additional memory opening fill structures 58 located within the additional memory openings 49, wherein each of the memory opening fill structure 58 and the additional memory opening fill structures 58 comprises a respective vertical NAND string. In this case, the memory device comprises a three-dimensional memory array including a three-dimensional array of discrete memory elements 54.

The exemplary structures can include a three-dimensional memory device. In one embodiment, the three-dimensional memory device comprises a three-dimensional NAND memory device. The electrically conductive layers 46 can comprise, or can be electrically connected to, a respective word line of the three-dimensional NAND memory device. The substrate (9, 10) can comprise a silicon substrate. The vertical NAND memory device can comprise an array of three-dimensional NAND strings over the silicon substrate. At least one memory element 54 in a first device level of the array of three-dimensional NAND strings can be located over another memory element 54 in a second device level of the array of three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of three-dimensional NAND strings can comprise: a plurality of semiconductor channels (59, 11, 60); and a plurality of memory elements 54 (which may be charge storage elements, ferroelectric memory elements, resistive memory elements, or ferroelectric memory elements). Each memory element 54 can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a memory device, comprising:
    forming a vertical repetition of a unit layer stack, wherein the unit layer stack comprises a sacrificial material layer and a set of layers including, from bottom to top, a lower insulating sublayer, a first spacer-level sacrificial sublayer, a disposable material sublayer, a second spacer-level sacrificial sublayer, and an upper insulating sublayer;
    forming memory openings through the vertical repetition;
    forming memory opening fill structures in the memory openings, wherein each of the memory opening fill structures comprises a vertical semiconductor channel and a memory material layer;
    forming a backside trench through the vertical repetition;
    forming insulating-level backside recesses by removing the disposable material sublayers selective to materials of the sacrificial material layers, the lower insulating sublayers, the first spacer-level sacrificial sublayers, the second spacer-level sacrificial sublayers, and the upper insulating sublayers employing a first isotropic etch process;
    removing the first spacer-level sacrificial sublayers and the second spacer-level sacrificial sublayers selective to the lower insulating sublayers and the upper insulating sublayers employing a second isotropic etch process, whereby the insulating-level backside recesses are expanded in volume;
    depositing center insulating sublayers within the insulating-level backside recesses, wherein each contiguous combination of a lower insulating sublayer, an upper insulating sublayer, and a center insulating sublayer comprises a composite insulating layer, and wherein an alternating stack of composite insulating layers and the sacrificial material layers is formed; and
    replacing the sacrificial material layers with electrically conductive layers after the step of depositing the center insulating sublayers.

2. The method of claim 1, further comprising dividing each of the memory material layers into a respective vertical stack of memory material portions employing the second isotropic etch process or employing an additional isotropic etch process after the first isotropic etch process and prior to depositing the center insulating sublayers.

3. The method of claim 2, wherein:
    each of the memory opening fill structures comprises a blocking dielectric layer that laterally surrounds a respective one of the memory material layers; and
    the method further comprises dividing each of the blocking dielectric layers into a respective vertical stack of blocking dielectric portions.

4. The method of claim 3, each of the blocking dielectric portions comprises at least one concave annular surface that contacts a respective one of the center insulating sublayers and laterally surrounds the vertical semiconductor channel.

5. The method of claim 2, wherein:
    each of the memory opening fill structures comprises a dielectric material liner that laterally surrounds a respective one of the vertical semiconductor channels and is laterally surrounded by a respective one of the memory material layers;
    the second isotropic etch process employs an etch chemistry that etches a material of the memory material layers selective to a material of the dielectric material liners, whereby a vertical stack of discrete memory elements is formed around each of the dielectric material liners; and
    the center insulating sublayers are formed directly on the dielectric material liners and the discrete memory elements.

6. The method of claim 5, wherein:
    the memory material portions comprise charge storage material portions; and the dielectric material liners comprise tunneling dielectric layers.

7. The method of claim 5, wherein each center insulating sublayer other than a topmost one and a bottommost one of the center insulating sublayers contacts an annular concave bottom surface of a respective overlying discrete memory element, and contacts an annular concave top surface of a respective underlying discrete memory element.

8. The method of claim 1, wherein the sacrificial material layers comprise silicon nitride having a first density, and the first and the second spacer-level sacrificial sublayers comprise silicon nitride having a second density which is less than the first density.

9. The method of claim 1, wherein the sacrificial material layers comprise silicon or silicon-germanium having a first germanium concentration, and the first and the second spacer-level sacrificial sublayers comprise germanium or silicon-germanium having a second germanium concentration which is greater than the first germanium concentration.

* * * * *